(12) United States Patent
Yamashita et al.

(10) Patent No.: US 6,777,758 B2
(45) Date of Patent: Aug. 17, 2004

(54) SEMICONDUCTOR DEVICE

(75) Inventors: Tomohiro Yamashita, Tokyo (JP); Yoshinori Okumura, Tokyo (JP); Katsuyuki Horita, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 60 days.

(21) Appl. No.: 09/754,325

(22) Filed: Jan. 5, 2001

(65) Prior Publication Data

US 2002/0008224 A1 Jan. 24, 2002

(30) Foreign Application Priority Data

Jul. 18, 2000 (JP) ..................................... P2000-217106

(51) Int. Cl.[7] .............................................. H01L 29/76
(52) U.S. Cl. ...................... 257/369; 257/371; 257/377; 438/521; 438/529
(58) Field of Search ................................ 257/368–371, 257/377, 379, 381, 382, 655, 657; 438/275, 276, 510, 518, 519, 521, 526, 527, 529

(56) References Cited

U.S. PATENT DOCUMENTS

| | | | | |
|---|---|---|---|---|
| 3,244,949 A | * | 4/1966 | Hilbiber ..................... 257/577 |
| 4,426,766 A | * | 1/1984 | Lee ............................. 257/376 |
| 5,519,243 A | * | 5/1996 | Kikuda et al. .............. 257/296 |
| 5,622,876 A | * | 4/1997 | Zambrano et al. .......... 438/135 |
| 5,629,545 A | * | 5/1997 | Leach ......................... 257/362 |
| 5,843,813 A | * | 12/1998 | Wei et al. ................... 438/200 |
| 6,066,520 A | * | 5/2000 | Suzuki ....................... 438/202 |
| 6,329,694 B1 | * | 12/2001 | Lee et al. ................... 257/372 |
| 6,384,455 B1 | * | 5/2002 | Nishigohri ................. 257/371 |

FOREIGN PATENT DOCUMENTS

JP 59-205751 * 11/1984 ............... 257/371

OTHER PUBLICATIONS

Wolf, Silicon processing for the VLSI era, 1995, Lattice press, vol. 3, p. 523.*

* cited by examiner

*Primary Examiner*—Ori Nadav
(74) *Attorney, Agent, or Firm*—Oblon, Spivak, McClelland, Maier & Neustadt, P.C.

(57) ABSTRACT

P wells (11, 12) having different impurity profiles are adjacently formed in a surface (50S) of a semiconductor substrate (50). A P-type layer (20) having lower resistivity than the P wells (11, 12) is formed in the surface (50S) across the P wells (11, 12), so that the P wells (11, 12) are electrically connected with each other through the P-type layer (20). Contacts (31, 32) fill in contact holes (70H1, 70H2) formed in an interlayer isolation film (70) respectively in contact with the P-type layer (20). The contacts (31, 32) are connected to a wire (40). The wire (70) is connected to a prescribed potential, thereby fixing the P wells (11, 12) to prescribed potentials through the contacts (31, 32) and the P-type layer (20). Thus, the potentials of the wells can be stably fixed and the layout area of elements for fixing the aforementioned potentials can be reduced.

14 Claims, 26 Drawing Sheets

F I G . 1
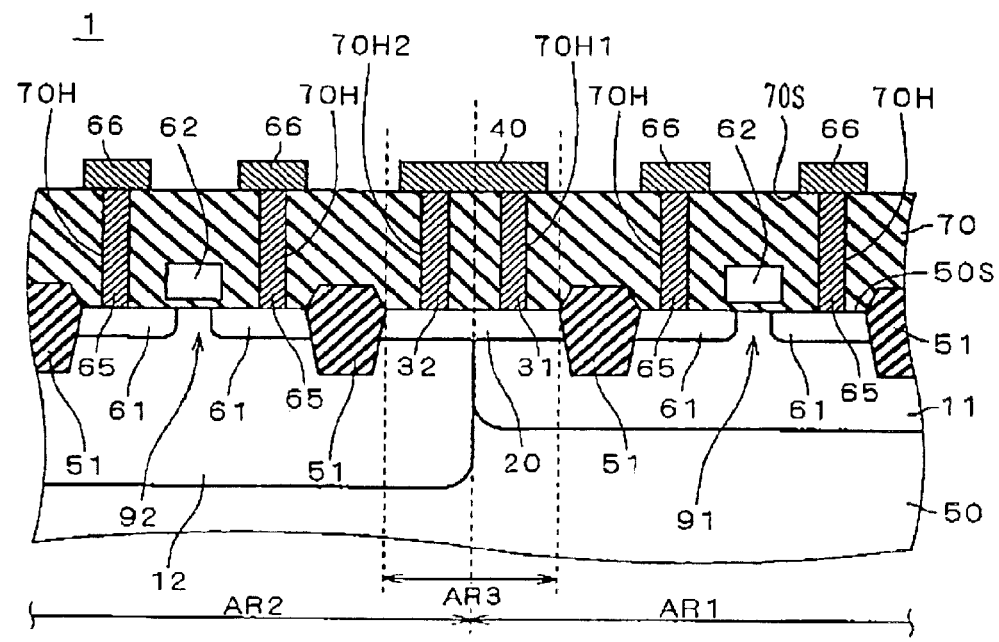
F I G . 2
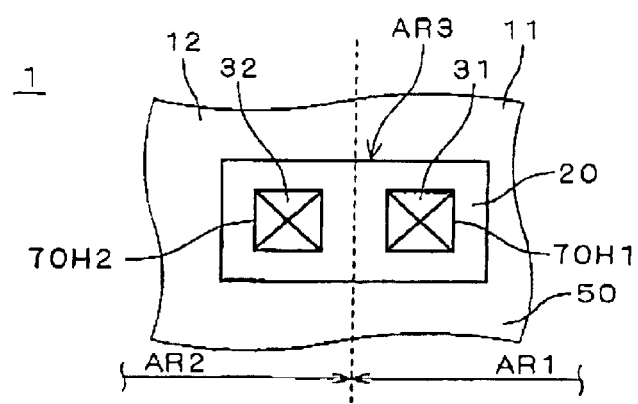

F I G. 7
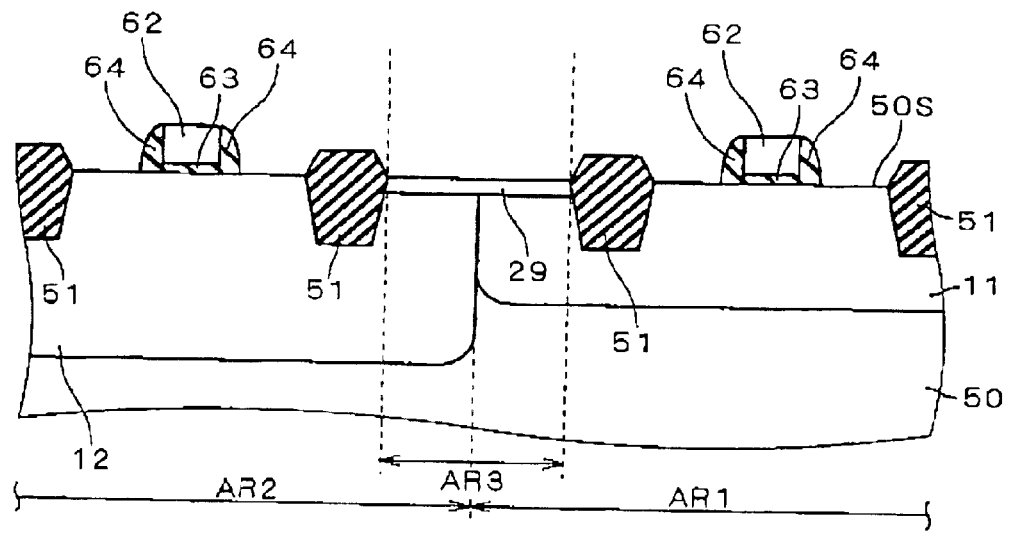
F I G. 8
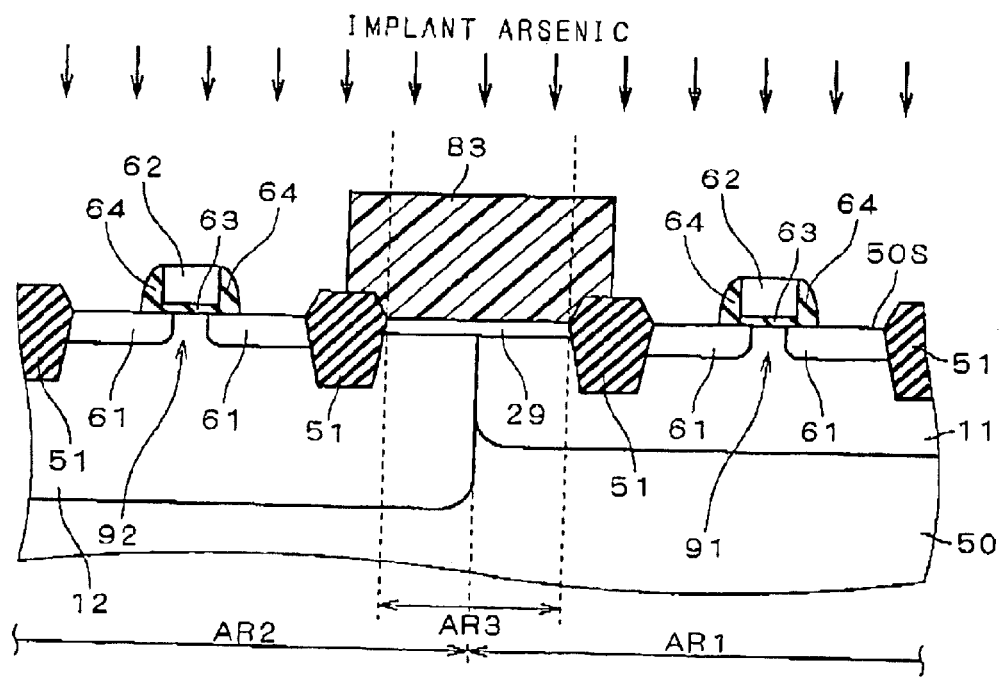

F I G . 1 2
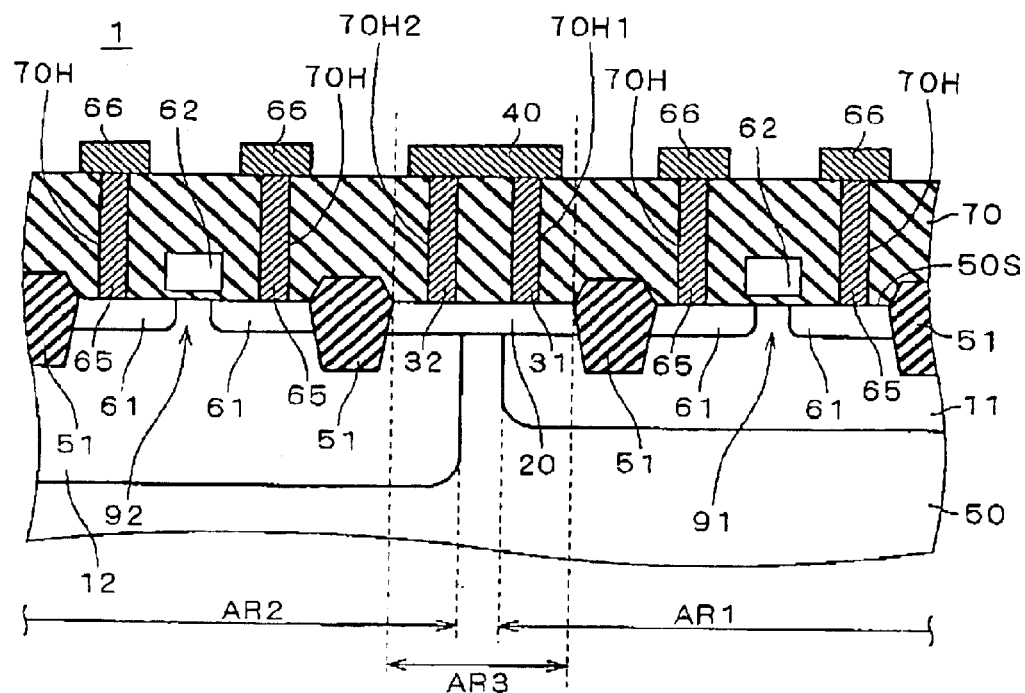
F I G . 1 3
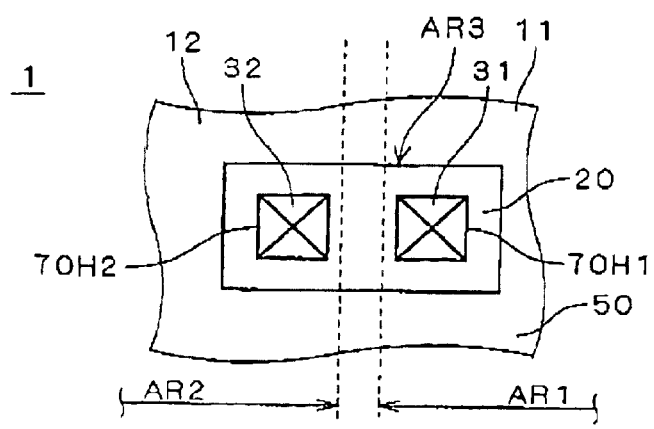

F I G . 14
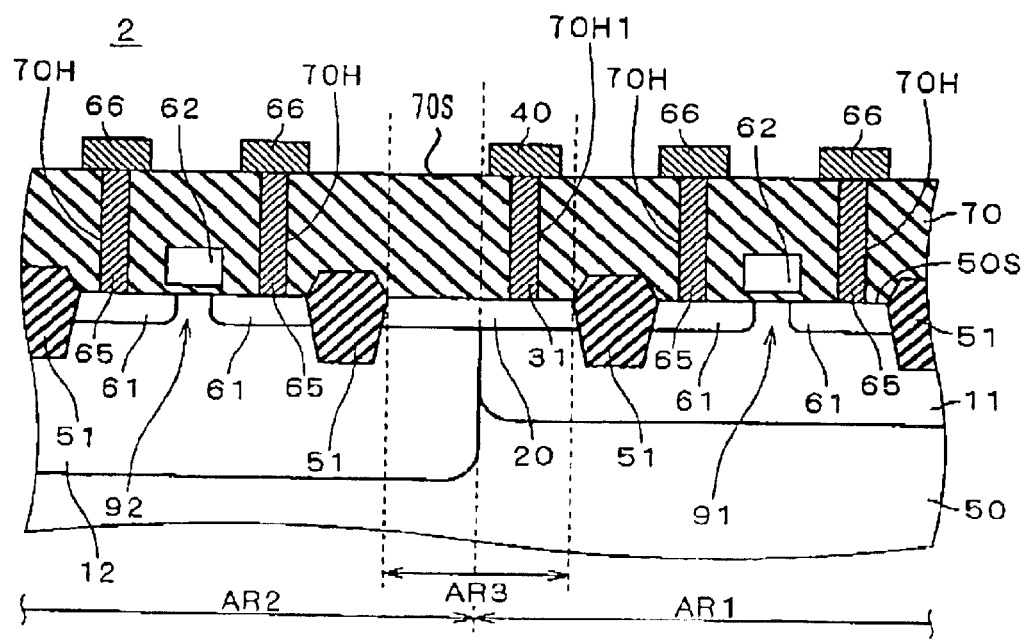
F I G . 15
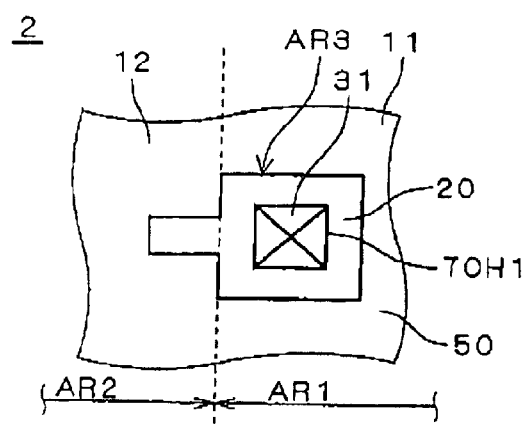

F I G . 17
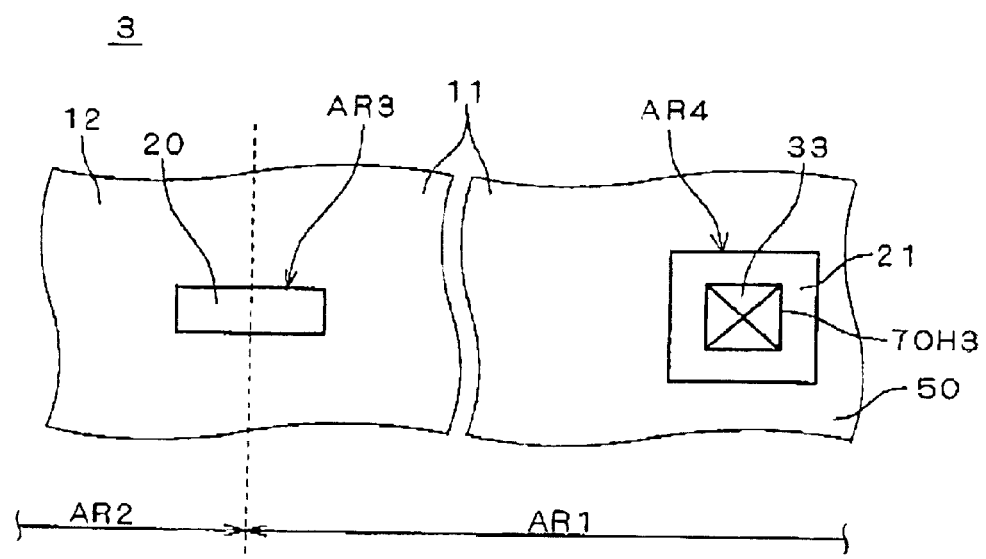

F I G . 21
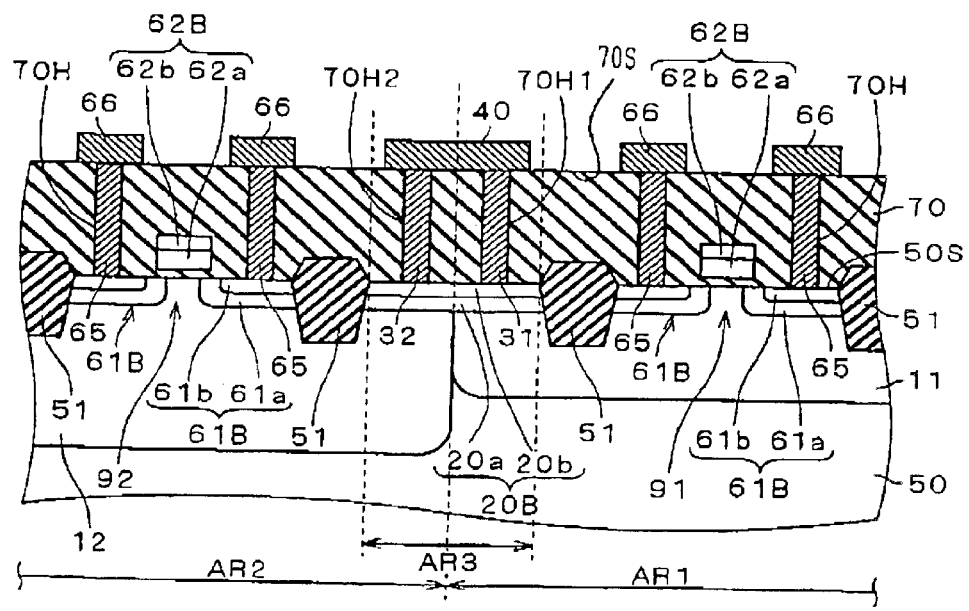

US 6,777,758 B2

SEMICONDUCTOR DEVICE

BACKGROUND OF THE INVENTION

1. Field of the Invention

The present invention relates to a semiconductor device, and more particularly, it relates to a technique of reducing the layout area of elements for fixing the potentials of wells in a semiconductor device.

2. Description of the Background Art

In a semiconductor integrated circuit, it is important to optimize the electric characteristics of individual elements and reduce the width of spaces between the elements, in order to improve the performance of and refine the integrated circuit. In general, a MOSFET is formed on a well prepared by doping a surface of a semiconductor substrate with an impurity. For example, an N-type MOSFET (hereinafter also referred to as "NMOSFET") is formed on a P-type well (hereinafter also referred to as "P well").

In this case, a plurality of types of NMOSFETs having different transistor characteristics can be formed on the same semiconductor substrate by adjusting only impurity profiles of portions close to surfaces of P wells or regions shallower than an element isolation insulator film (hereinafter also referred to as "element isolation film"). Alternatively, the characteristics of NMOSFETs formed on the same substrate can be made different from each other by adjusting impurity profiles of deeper regions, in order to optimize the electric characteristics of the elements. In other words, a plurality of types of P wells having different impurity profiles are prepared for forming NMOSFETs different in characteristic and application from each other on the P wells respectively.

FIG. 22 is a sectional view of a conventional semiconductor device 1P, and FIG. 23 is a typical plan view or layout diagram for illustrating a part of the semiconductor device 1P. In the semiconductor device 1P, P wells 11P and 12P having different impurity profiles are formed in a surface 50SP of a semiconductor substrate (hereinafter also referred to as "substrate") 50P. In particular, an element isolation film 51BP is formed at the boundary between the wells 11P and 12P in the conventional semiconductor device 1P.

An NMOSFET 91P is formed on the P well 11P, and a P-type semiconductor layer (hereinafter also referred to as "P-type layer") 21P for fixing the potential of the P well 11P is formed in the P well 11P. Similarly, an NMOSFET 92P different in characteristic from the aforementioned NMOSFET 91P is formed on the P well 12P, and a P-type layer 22P for fixing the potential of the P well 12P is formed in the P well 12P. While the P-type layers 21P and 22P are formed in the vicinity of the boundary between the P wells 11P and 12P in FIG. 22, the P-type layers 21P and 22P may alternatively be formed on other portions in the P wells 11P and 12P respectively. Element isolation films 51P and 51BP isolate the NMOSFETs 91P and 92P and the P-type layers 21P and 22P from each other.

The P-type layers 21P and 22P are connected to a wire 40P through contacts 31P and 32P provided in contact holes 70H1P and 70H2P formed in an interlayer isolation film 70P respectively. The wire 40P is connected to a prescribed potential, thereby fixing the P wells 11P and 12P to the prescribed potential through the contacts 31P and 32P and the P-type layers 21P and 22P.

Source/drain regions 61P of the NMOSFETs 91P and 92P are formed in the surface 50SP, and gate insulator films 63P (see FIG. 26) and gate electrodes 62P are successively formed on the surface 50SP. The source/drain regions 61P are connected to wires 66P through contacts 65P provided in contact holes 70HP formed in the interlayer isolation film 70P.

FIGS. 24 to 29 are sectional views for illustrating a method of manufacturing the semiconductor device 1P. The method of manufacturing the semiconductor device 1P is now described with reference to these drawings.

First, the element isolation films 51P and 51BP are formed in the surface 50SP of the substrate 50P for separating regions for forming the NMOSFETs 91P and 92P and the P-type layers 21P and 22P from each other.

Then, a resist film 81P is arranged on the surface 50SP while opening a region for forming the P well 12P for ion-implanting a P-type impurity into the surface 50SP through the resist film 81P serving as a mask (see FIG. 24). More specifically, boron is implanted, for example, under conditions of 300 keV to 1.5 MeV and $1 \times 10^{12}$ to $1 \times 10^{14}/cm^2$ for forming a retrograde well, under implantation conditions of 80 keV to 160 keV and $1 \times 10^{12}$ to $5 \times 10^{13}/cm^2$ for a channel-cut layer, and under implantation conditions of 15 keV to 70 keV and $3 \times 10^{12}$ to $5 \times 10^{13}/cm^2$ for a threshold control layer, thereby forming the P well 12P consisting of the retrograde well, channel-cut layer and threshold control layer.

Then, a resist film 82P is arranged on the surface 50SP while opening a region for forming the P well 11P for ion-implanting a P-type impurity into the surface 50SP through the resist film 82P serving as a mask (see FIG. 25). More specifically, boron is implanted, for example, under conditions of 200 keV to 500 keV and $5 \times 10^{12}$ to $1 \times 10^{14}/cm^2$ for forming a retrograde well, under implantation conditions of 80 keV to 160 keV and $3 \times 10^{12}$ to $2 \times 10^{13}/cm^2$ for a channel-cut layer, and under implantation conditions of 15 keV to 70 keV and $5 \times 10^{12}$ to $1 \times 10^{14}/cm^2$ for a threshold control layer, thereby forming the P well 11P consisting of the retrograde well, channel-cut layer and threshold control layer.

Thereafter N-type wells are formed in regions for forming NMOSFETs (not shown).

Thereafter films for the gate insulator films 63P and the gate electrodes 62P are formed and patterned into prescribed shapes, thereby forming the gate insulator films 63P and the gate electrodes 62P (see FIG. 26). N-type extension layers 69P are formed at the source/drain regions of the NMOSFETs, and P-type extension layers are formed at source/drain regions of the PMOSFETs (see FIG. 27). While P-type extension layers 29P are formed in regions for forming the P-type layers 21P an 22P, formation of such extension layers 29P may be omitted. Thereafter an insulator film is formed to entirely cover the surface 50SP and anisotropically etched thereby forming side-wall-spacers (hereinafter also referred to as "spacers") 64P.

Then, a resist film 83P is arranged on the surface 50SP while opening regions for forming the NMOSFETs 91P and 92P and regions for forming N-type layers for fixing the potentials of the N wells (not shown) for ion-implanting an N-type impurity into the surface 50SP through the resist film 83P serving as a mask (see FIG. 28). For example, arsenic is implanted under conditions of 5 keV to 100 keV and $1 \times 10^{15}$ to $6 \times 10^5/cm^2$, thereby forming the source/drain regions 61P of the NMOSFETs 91P and 92P and the aforementioned N-type layers.

Then, a resist film 84P is arranged on the surface 50SP while opening regions for forming the P-type layers 21P and 22P and the PMOSFETs for ion-implanting a P-type impurity into the surface 50SP through the resist film 84P serving as a mask (see FIG. 29). For example, boron is implanted under conditions of 1 keV to 20 keV and $1 \times 10^{15}$ to $6 \times 10^{15}/$ cm$^2$, thereby forming the P-type layers 21P and 22P and the source/drain regions of the PMOSFETs.

Then, the interlayer isolation film 70P is formed entirely over the surface 50S to cover the gate electrodes 62P etc., and the contact holes 70HP, 70H1P and 70H2P are formed in prescribed positions respectively. A conductive material such as a metal or polysilicon is deposited to cover the overall surface of the interlayer isolation film 70P, thereby forming the contacts 31P, 32P and 65P and the wires 40P and 66P. The semiconductor device 1P shown in FIG. 22 is completed through the aforementioned steps. A plurality of wiring layers are formed at need for manufacturing an LSI.

When the masks etc. are misaligned in the photolithography steps (see FIGS. 24 and 25) for forming the wells 11P and 12P respectively, the P wells 11P and 12P may be separated from each other (see a sectional view shown in FIG. 30). Also in this case, the P wells 11P and 12P can be fixed to a prescribed potential since the P-type layers 21P and 22P and the contacts 31P and 32P are provided for the P wells 11P and 12P respectively.

Also when the wells 11P and 12P are enclosed with a bottom N well 13P and an N well 14P as shown in a sectional view of FIG. 31 and a plan view of FIG. 32, the P wells 11P and 12P may be separated from each other. If the P wells 11P and 12P are not electrically connected with each other, the potentials of the P wells 11P and 12P tend to float. Also in the semiconductor device having the aforementioned bottom N well 13P and the N well 14P, therefore, the P-type layers 21P and 22P and the contacts 31P and 32P are provided for the P wells 11P and 12P respectively.

In the conventional semiconductor device 1P or the like, the element isolation film 51P separates the regions for forming the MOSFETs from each other while the element isolation film 51BP is also formed at the boundary between the P wells 11P and 12P, and hence diffusion layers for fixing the potentials of the wells, the contacts and the wires must be provided for the respective wells. Therefore, the ratio of regions for forming the aforementioned diffusion layers etc. is disadvantageously increased in the overall semiconductor device. Particularly when the P-type layers 21P and 22P of the wells 11P and 12P are not arranged in proximity to each other, the layout area for the wire 40P increases the aforementioned ratio.

SUMMARY OF THE INVENTION

According to a first aspect of the present invention, a semiconductor device comprises a semiconductor substrate, a first well of a prescribed conductivity type selectively formed in a surface of the semiconductor substrate, a second well of the same conductivity type as the prescribed conductivity type selectively formed in the surface of the semiconductor substrate, a first conductive layer, which is formed by lowering the resistivity of the surface, across the first well and the second well in the surface of the semiconductor substrate with an end provided on the first well and another end provided on the second well and a first contact electrically connected with the first well.

According the first aspect, the first well and the second well are electrically connected with each other through the first conductive layer, whereby the potential of the second well can be fixed by fixing the potential of the first well through the first contact. In other words, the potentials of the first and second wells can be simultaneously fixed by the first contact. In this case, the potential of the second well can be stably fixed through the first conductive layer regardless of contact/non-contact between the first and second wells.

According to this aspect, further, there is no need to provide conductive layers and contacts for the first well and the second well respectively. As compared with the conventional semiconductor device provided with the conductive layers and the contacts for the first well and the second well respectively, therefore, the layout area of elements for fixing the potentials of the first well and the second well can be reduced. In particular, the aforementioned layout area can be remarkably reduced by so providing the first conductive layer as to connect the adjacent first and second wells at the minimum distance. Thus, the overall size of the semiconductor device (or chip) can be so reduced that the number of semiconductor devices obtainable from a unit wafer is increased and the cost can be reduced.

In this case, wires other than those for fixing the potentials of the first and second wells can be arranged in the vicinity of the first conductive layer by bringing only the first contact into contact with the first conductive layer. In other words, the degree of freedom in layout is improved as compared with the case of providing a plurality of contacts in contact with the first conductive layer.

According to a second aspect of the present invention, the first contact is in contact with the first conductive layer.

According to the second aspect, the first contact can be reliably electrically connected with the first well through the first conductive layer, whereby the potentials of the first and second wells can be stably fixed.

According to a third aspect of the present invention, the semiconductor device further comprises a second contact in contact with the first conductive layer.

According to the third aspect, the total resistance of the contacts for fixing the potentials of the first and second wells can be reduced as compared with the case provided with only the first contact.

According to a fourth aspect of the present invention, the first contact is arranged in opposition to the first well through the first conductive layer while the second contact is arranged in opposition to the second well through the first conductive layer.

According to the fourth aspect, the first contact is in proximity to the first well through the first conductive layer and the second contact is in proximity to the second well through the second conductive layer. Thus, the potential of the first well can be more stably fixed through the first contact, and the potential of the second well can be more stably fixed through the second contact.

According to a fifth aspect of the present invention, the semiconductor device further comprises a second conductive layer formed in the surface of the semiconductor substrate by lowering the resistivity of the surface and provided on the first well without being in contact with the second well, and the first contact is in contact with the second conductive layer.

According to the fifth aspect, the first contact and the first well can be reliably electrically connected with each other through the second conductive layer, whereby the potential of the first well can be stably fixed. In this case, the potential of the second well can be stably fixed through the first conductive layer regardless of contact/non-contact between the first and second wells.

In this case, it is possible to eliminate necessity of providing a contact for the first conductive layer. Therefore, the layout area of the first conductive layer can be reduced as compared with the case of providing a contact for the first conductive layer, whereby miniaturization of the semiconductor device, increase of the number of semiconductor devices obtainable from a unit wafer and reduction of the cost can be attained. Further, it is not at all necessary to provide a wire for a contact connected with the first conductive layer in the vicinity of the first conductive layer, whereby another wire can be arranged in the vicinity of the first conductive layer. In other words, the degree of freedom in layout is further improved.

According to a sixth aspect of the present invention, the first conductive layer includes at least one of an impurity introduction layer of the same conductivity type as the prescribed conductivity type and a compound layer of the material for the semiconductor substrate and a metal.

According to the sixth aspect, the first conductive layer can be reliably supplied with conductivity. In particular, the resistivity of the first conductive layer can be remarkably reduced due to the compound layer, and the potentials of the first and second wells can be more stably fixed as compared with the case of the first conductive layer consisting of only the impurity introduction layer.

According to a seventh aspect of the present invention, the first conductive layer has lower resistivity than the first well and the second well.

According to the seventh aspect, the wells and the contact can be excellently brought into ohmic contact with each other.

According to an eighth aspect of the present invention, the second conductive layer includes at least one of an impurity introduction layer of the same conductivity type as the prescribed conductivity type and a compound layer of the material for the semiconductor substrate and a metal.

According to the eighth aspect, the second conductive layer can be reliably supplied with conductivity. In particular, the resistivity of the second conductive layer can be remarkably reduced due to the compound layer, and the potentials of the first and second wells can be more stably fixed as compared with the case of the second conductivity layer consisting of only the impurity introduction layer.

According to a ninth aspect of the present invention, the second conductive layer has lower resistivity than the first well.

According to the ninth aspect, the wells and the contact can be excellently brought into ohmic contact with each other.

According to a tenth aspect of the present invention, the first well and the second well have different impurity profiles.

According to the tenth aspect, the first and second wells having different impurity profiles are generally formed through different steps with different masks. Also when misalignment results from employment of different masks and the first and second wells are not in contact with each other, any of the aforementioned effects according to the first to ninth aspects can be attained.

An object of the present invention is to provide a semiconductor device capable of stably fixing the potentials of wells and reduced in layout area of elements for fixing the potentials.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a sectional view of a semiconductor device according to an embodiment 1 of the present invention;

FIG. 2 is a typical plan view for illustrating a part of the semiconductor device according to the embodiment 1;

FIGS. 3 to 11 are sectional views for illustrating a method of manufacturing the semiconductor device according to the embodiment 1;

FIG. 12 is a sectional view for illustrating the semiconductor device according to the embodiment 1;

FIG. 13 is a typical plan view for illustrating the part of the semiconductor device shown in FIG. 12;

FIG. 14 is a sectional view of a semiconductor device according to an embodiment 2 of the present invention;

FIG. 15 is a typical plan view for illustrating a part of the semiconductor device according to the embodiment 2;

FIG. 17 is a typical plan view for illustrating a part of the semiconductor device according to the embodiment 3;

FIG. 21 is a sectional view of a semiconductor device according to a modification 1 of the embodiment 4;

DESCRIPTION OF THE PREFERRED EMBODIMENTS

<Embodiment 1>

Figure 3:
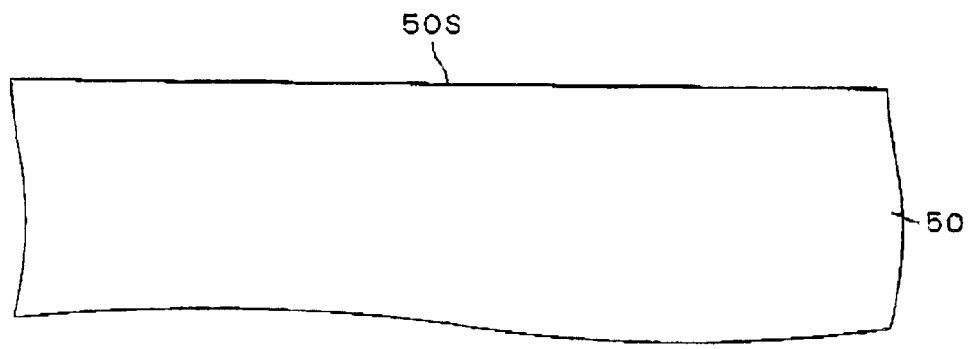
Figure 4:
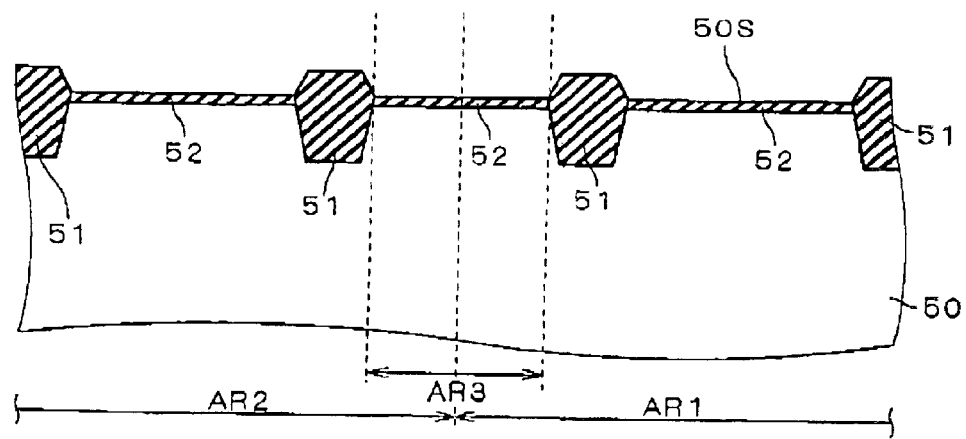

FIG. 1 is a sectional view of a semiconductor device 1 according to an embodiment 1 of the present invention, and FIG. 2 is a typical plan view or layout diagram for illustrating a part of the semiconductor device 1. The semiconductor device 1 has a semiconductor substrate (hereinafter also referred to as "substrate") 50 as a base, so that structures described later are formed in and on a surface (or a main surface) 50S of the semiconductor substrate 50. In the following description, it is assumed that the expression "the surface 50S of the substrate 50" includes the initial surface of a state (see FIG. 3) not yet subjected to various treatment and a surface corresponding to the initial surface. While the semiconductor substrate 50 consists of N-type silicon and respective semiconductor layers described later are prepared from silicon in this description, semiconductor materials are not restricted to these.

As shown in FIG. 1, an N-type MOSFET (hereinafter also referred to as "NMOSFET") 91 is formed in an area AR1 of the semiconductor device 1, and an NMOSFET 92 different in characteristic from the NMOSFET 91 is formed in an area AR2 adjacent to the area AR1. Referring to FIG. 1, the areas AR1 an AR2 are in contact with each other. It is assumed here that the areas AR1 and AR2 and an area AR3 described later include prescribed areas of the surface 50S of the substrate 50 as well as three-dimensional areas extending the prescribed areas perpendicularly with respect to the surface 50S.

The structure in the area AR1 is now described. In the area AR1, a P-type well (or first well) (hereinafter also referred to as "P well") 11 having a prescribed depth is formed in the surface 50S of the substrate 50. In order to simplify the description, it is assumed here that the P well 11 is formed entirely over the surface 50S in the area AR1. While the P well 11 includes a retrograde well, a channel-cut layer and a threshold control layer, FIG. 1 etc. omit detailed illustration of these elements for avoiding complication of the figures.

Further, element isolation insulator films (hereinafter also referred to as "element isolation films") 51 of silicon oxide, for example, are formed in the surface 50S for isolating an element forming region for forming the NMOSFET 91.

In this element forming region, source/drain regions 61 of the NMOSFET 91 consisting of an N-type semiconductor layer are formed in the surface 50S to be shallower than the P well 11. Further, a gate insulator film 63 (see FIG. 7), consisting of silicon oxide, for example, of the NMOSFET 91 is formed on the surface 50S. The gate insulator film 63 is formed on a region corresponding to the gap between the source/drain regions 61. A gate electrode 62, consisting of polysilicon, for example, of the NMOSFET 91 is formed on the gate insulator film 63. Side-wall-spacers (hereinafter also referred to as "spacers") 64 (see FIG. 7) are formed on the surface 50S to cover side surfaces of the gate electrode 62.

An interlayer isolation film 70 of silicon oxide, for example, is formed on the surface 50S to cover the gate electrode 62 etc. The gate insulator film 63 and the spacers 64 are integrated with the interlayer isolation film 70. The interlayer isolation film 70 is formed not only in the area AR1 but also in the areas AR2 and AR3, to entirely cover the surface 50S. The interlayer isolation film 70 is formed with contact holes 70H extending from a surface 70S which is not in contact with the surface 50S toward the source/drain regions 61, and these contact holes 70H are filled with contacts 65 consisting of a conductive material such as a metal or polysilicon, for example, in contact with the source/drain regions 61. Further, wires 66 are formed on the surface 70S of the interlayer isolation film 70 in contact with the contacts 65.

The structure in the area AR2 is now described. The structures in the areas AR1 and AR2 are basically identical to each other and hence elements equivalent to the aforementioned ones are denoted by the same reference numerals. In the area AR2, a P well (or second well) 12 having a prescribed depth is formed in the surface 50S of the substrate 50. The P well 12 is deeper than the aforementioned P well 11, and has an impurity profile different from that of the P well 11. In order to simplify the description, it is assumed here that the P well 12 is formed entirely over the surface 50S in the area AR2. While the P well 12 includes a retrograde well, a channel-cut layer and a threshold control layer similarly to the P well 11, FIG. 1 etc. omit detailed illustration of these elements.

In the area AR2, element isolation films 51 as well as source/drain regions 61, a gate electrode 62 and a gate insulator film 63 of the NMOSFET 92 are formed similarly to the area AR1. Further, the spacers 64, the interlayer isolation film 70 having contact holes 70H, contacts 65 and wires 66 are formed in the area AR2.

In particular, the semiconductor device 1 has the area AR3 extending over the adjacent areas AR1 and AR2 with the minimum distance. The area AR3 includes areas overlapping with the areas AR1 and AR2 respectively, and the P wells 11 and 12 are partially arranged in the area AR3. A conductive layer (or first conductive layer) 20 is formed in the surface 50S located in the area AR3 (to extend) over the P wells 11 and 12. In more detail, the conductive layer 20, having an end provided on the P well 11 and another end provided on the P well 12, electrically connects the P wells 11 and 12 with each other.

The conductive layer 20 consists of a P-type semiconductor layer (or impurity introduction layer) formed shallower than the P wells 11 and 12 (described later) by reducing (or lowering) the resistivity of the surface 50S of the semiconductor substrate 50 to have lower resistivity than the P wells 11 and 12 (i.e. to be conductive). The conductive layer 20 is also referred to as "P-type layer 20". The sheet resistance of the conductive layer 20 is about 100 to 10 k$\Omega$/□, for example.

The P-type layer 20 may alternatively be formed deeper than the P well 11 or the P wells 11 and 12 so far as the same is formed over the P wells 11 and 12 to be capable of electrically connecting the P wells 11 and 12 with each other. In order to simplify the description, it is assumed here that the P-type layer 20 is formed entirely over the surface 50S in the area AR3.

The aforementioned interlayer isolation film 70 is formed also in the area AR3 and has contact holes 70H1 and 70H2 extending from the surface 70S toward the P-type layer 20. In more detail, the contact hole 70H1 is formed in a region where the areas AR1 and AR3 overlap with each other to be opposed to the P well 11 through the P-type layer 20, while the contact hole 70H2 is formed in a region where the areas AR2 and AR3 overlap with each other to be opposed to the P well 12 through the P-type layer 20.

A contact (or first contact) 31 consisting of a conductive material such as a metal or polysilicon, for example, is formed in the contact hole 70H1 in contact with the P-type layer 20, and a similar contact (or second contact) 32 is formed in the contact hole 70H2 in contact with the P-type layer 20. Thus, the contacts 31 and 32 are electrically connected with the P wells 11 and 12 through the P-type layer 20. Further, a wire 40 is formed on the surface 70S of the interlayer isolation film 70 in contact with both contacts 31 and 32.

In the semiconductor device 1, the wire 40 is connected to a prescribed potential thereby fixing the P wells 11 and 12 to the prescribed potential through the contacts 31 and 32 and the P-type layer 20.

Although not illustrated in FIG. 1 etc., the semiconductor device 1 comprises P-type MOSFETs (hereinafter also referred to as "PMOSFETs") 191 and 192 having relation similar to that of the NMOSFETs 91 and 92. A conductive layer (or first conductive layer) 120 corresponding to the P-type layer 20 is formed over an N-type well (or first well) (hereinafter also referred to as "N well") 111 for forming the PMOSFET 191 and an N well (or second well) 112 for forming the PMOSFET 192. The conductive layer 120 consists of an N-type semiconductor layer (or impurity introduction layer) having lower resistivity than the P wells 111 and 112 (i.e. conductive) (therefore, the conductive layer 120 is also referred to as "N-type layer 120"), and the N wells 111 and 112 are electrically connected with each other through the N-type layer 120. Further, contacts (or first and second contacts) 131 and 132 similar to the aforementioned contacts 31 and 32 are formed in contact with the N-type layer 120.

FIGS. 3 to 11 are sectional views for illustrating a method of manufacturing the semiconductor device 1. The method of manufacturing the semiconductor device 1 is described with reference to these figures. The following description is made with reference to the elements (NMOSFETs 91 and 92 etc.) illustrated in FIG. 1.

First, the semiconductor substrate 50 is prepared (see FIG. 3). The element isolation films 51 are formed in the surface 50S (see FIG. 4), for separating regions for forming the NMOSFETs 91 and 92 and the P-type layer 20. An insulator film 52 of silicon oxide, for example, is formed in the surface 50S located in each of the regions for forming the NMOSFETs 91 and 92 and the P-type layer 20.

Figure 5:
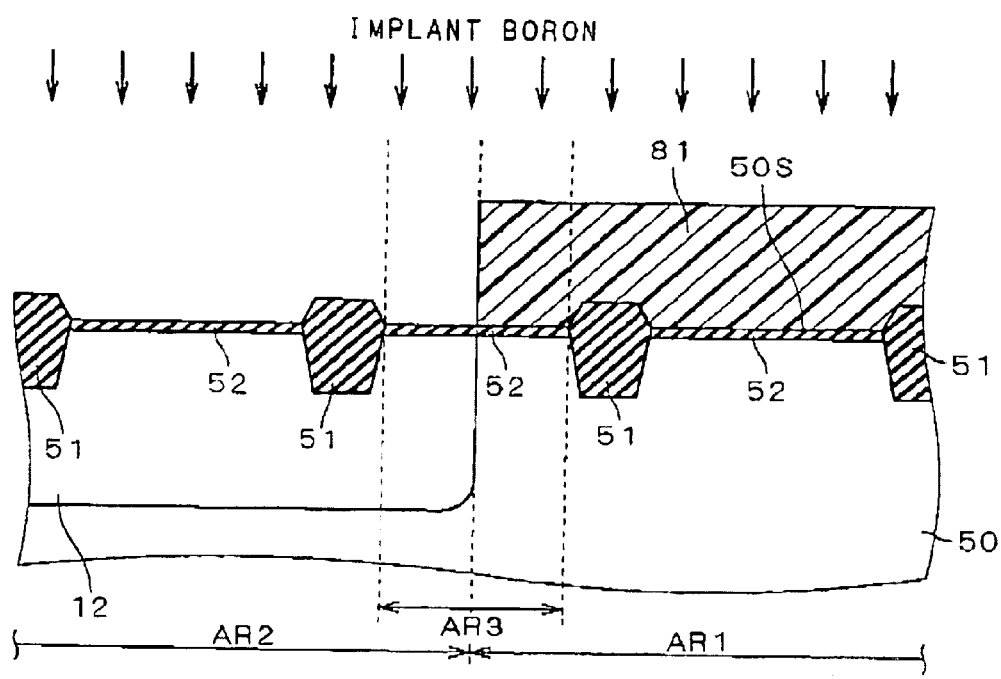

Then, a resist film 81 is arranged on the surface 50S while opening the area AR2 for ion-implanting a P-type impurity into the surface 50S through the resist film 81 serving as a mask (see FIG. 5). Thus, the P well 12 is formed in the area AR2. More specifically, the retrograde well, the channel-cut layer and the threshold control layer forming the P well 12 are formed as follows: For example, boron is implanted under conditions of 300 keV to 1.5 MeV and $1 \times 10^{12}$ to $1 \times 10^{14}/cm^2$ for forming the retrograde well, under implantation conditions of 80 keV to 160 keV and $1 \times 10^{12}$ to $5 \times 10^{13}/cm^2$ for the channel-cut layer, and under implantation conditions of 15 keV to 70 keV and $3 \times 10^{12}$ to $5 \times 10^{13}/cm^2$ for the threshold control layer. Thereafter the resist film 81 is removed.

Figure 6:
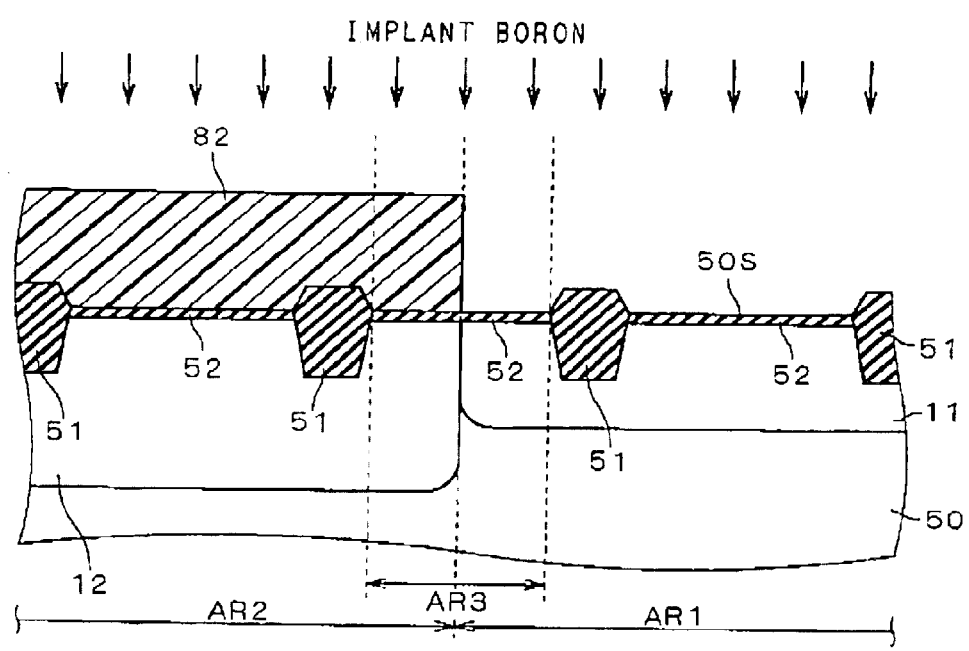

Then, a resist film 82 is arranged on the surface 50S while opening the area AR1 for ion-implanting a P-type impurity into the surface 50S through the resist film 82 serving as a mask (see FIG. 6). Thus, the P well 11 is formed in the area AR1. More specifically, the retrograde well, the channel-cut layer and the threshold control layer forming the P well 11 are formed as follows: For example, boron is implanted under conditions of 200 keV to 500 keV and $5 \times 10^{12}$ to $1 \times 10^{14}/cm^2$ for forming the retrograde well, under implantation conditions of 80 keV to 160 keV and $3 \times 10^{12}$ to $2 \times 10^{13}/cm^2$ for the channel-cut layer, and under implantation conditions of 15 keV to 70 keV and $5 \times 10^{12}$ to $1 \times 10^{14}/cm^2$ for the threshold control layer, for example. Thereafter the resist film 82 is removed.

Thereafter the N-type wells 111 and 112 are formed in regions for forming the PMOSFETs 191 and 192.

Then, the gate insulator films 63, the gate electrodes 62, extension layers (not shown) and the spacers 64 are formed (see FIG. 7). In more detail, films for the gate insulator films 63 and the gate electrodes 62 are prepared and patterned into prescribed shapes thereby forming the gate insulator films 63 and the gate electrodes 62. N-type extension layers are formed at the source/drain regions of the NMOSFETS, and P-type extension layers are formed at the source/drain regions of the PMOSFETs. While a P-type extension layer 29 is formed in the surface 50S located in the area AR3, formation of this extension layer 29 may be omitted. Thereafter an insulator film is formed on the surface 50S to cover the gate insulator films 63 and the gate electrodes 62 and anisotropically etched thereby forming the spacers 64.

Then, a resist film 83 is formed on the surface 50S while opening regions corresponding to the NMOSFETs 91 and 92 and the N-type layer 120 for ion-implanting an N-type impurity into the surface 50S through the resist film 83 serving as a mask (see FIG. 8). For example, arsenic is implanted under conditions of 5 keV to 100 keV and $1 \times 10^{15}$ to $6 \times 10^{15}/cm^2$, thereby forming the source/drain regions 61 of the NMOSFETs 91 and 92 and the N-type layer 120. Thereafter the resist film 83 is removed.

Figure 9:
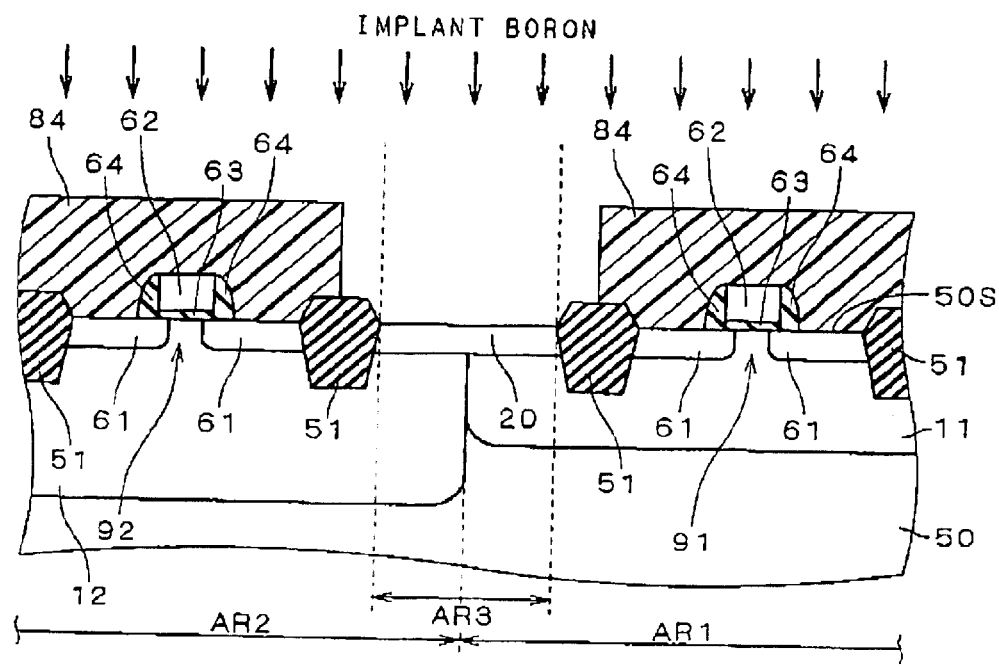

Then, a resist film 84 is formed on the surface 50S while opening regions corresponding to the PMOSFETs 191 and 192 and the P-type layer 20 for ion-implanting a P-type impurity into the surface 50S through the resist film 84 serving as a mask (see FIG. 9). For example, boron is implanted under conditions of 1 keV to 20 keV and $1 \times 10^{15}$ to $6 \times 10^{15}/cm^2$, thereby forming the source/drain regions of the PMOSFETs 191 and 192 and the P-type layer 20. Thereafter the resist film 84 is removed, thereby obtaining the substrate or the semiconductor device in the state shown in FIG. 10.

Figure 11:
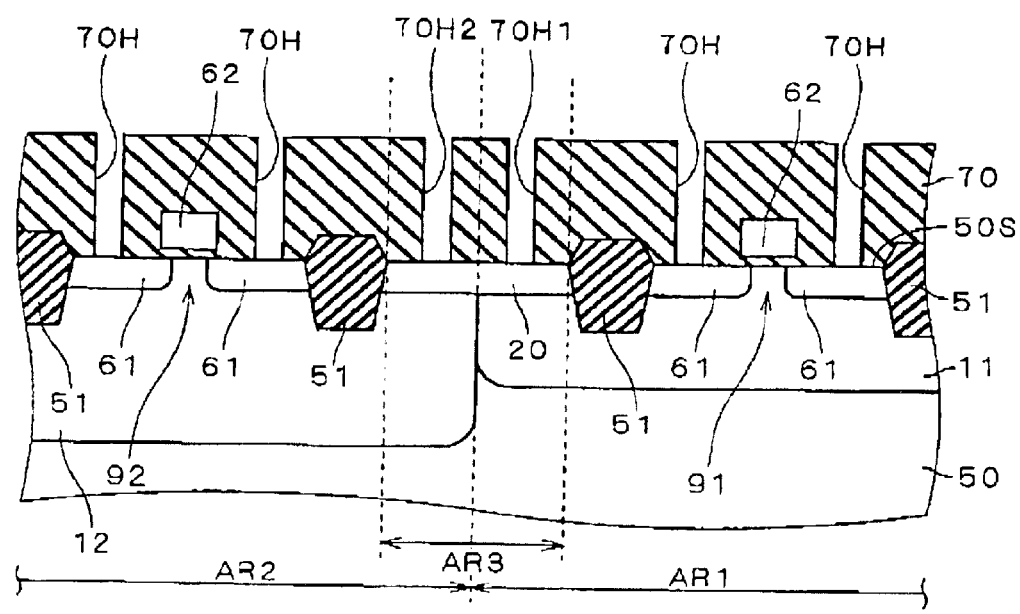

Then, the interlayer isolation film 70 is formed on the overall surface 50S to cover the gate electrodes 62 etc., and the contact holes 70H, 70H1 and 70H2 are formed in prescribed positions (see FIG. 11). Thereafter a conductive material such as a metal or polysilicon, for example, is deposited to cover the overall interlayer isolation film 70. Thus, the contacts 31, 32 and 65 are formed by filling the contact holes 70H, 70H1 and 70H2 with the conductive material. The conductive material deposited on the surface 70S of the interlayer isolation film 70 is patterned for forming the wires 40 and 66. The contacts 31, 32 and 65 and the wires 40 and 66 may be prepared from different materials through different steps. The semiconductor device 1 shown in FIG. 1 is completed through the aforementioned steps.

In addition to or in place of the NMOSFETs 91 and 92, memory cells of a DRAM (dynamic random access memory) or an EEPROM (electrically erasable and programmable read only memory) may be formed in the areas AR1 and AR2. In this case, a step of forming memory capacitors is added. A plurality of wiring layers are formed at need for completing an LSI.

The semiconductor device 1 can attain the following effects: The P-type layer 20 is formed (to extend) over the P wells 11 and 12, so that the P wells 11 and 12 are electrically connected with each other through the P-type layer 20. The contacts 31 and 32, arranged in contact with the P-type layer 20, are reliably electrically connected with the P wells 11 and 12 through the P-type layer 20. Further, the P-type layer 20 has lower resistivity than the P-wells 11 and 12, whereby the contacts 31, 32 and the P wells 11 and 12 are excellently brought into ohmic contact with each other. Therefore, the potentials of the P wells 11 and 12 can be simultaneously and stably fixed through the contacts 31 and 32 and the P-type layer 20.

Also when misalignment is caused by forming the P wells 11 and 12 through different masks, i.e., also when the P wells 11 and 12 are not in contact with each other as shown in a sectional view of FIG. 12 and a plan view of FIG. 13, the potential of the P wells 11, 12 can be stably fixed through the P-type layer 20.

Figure 22:
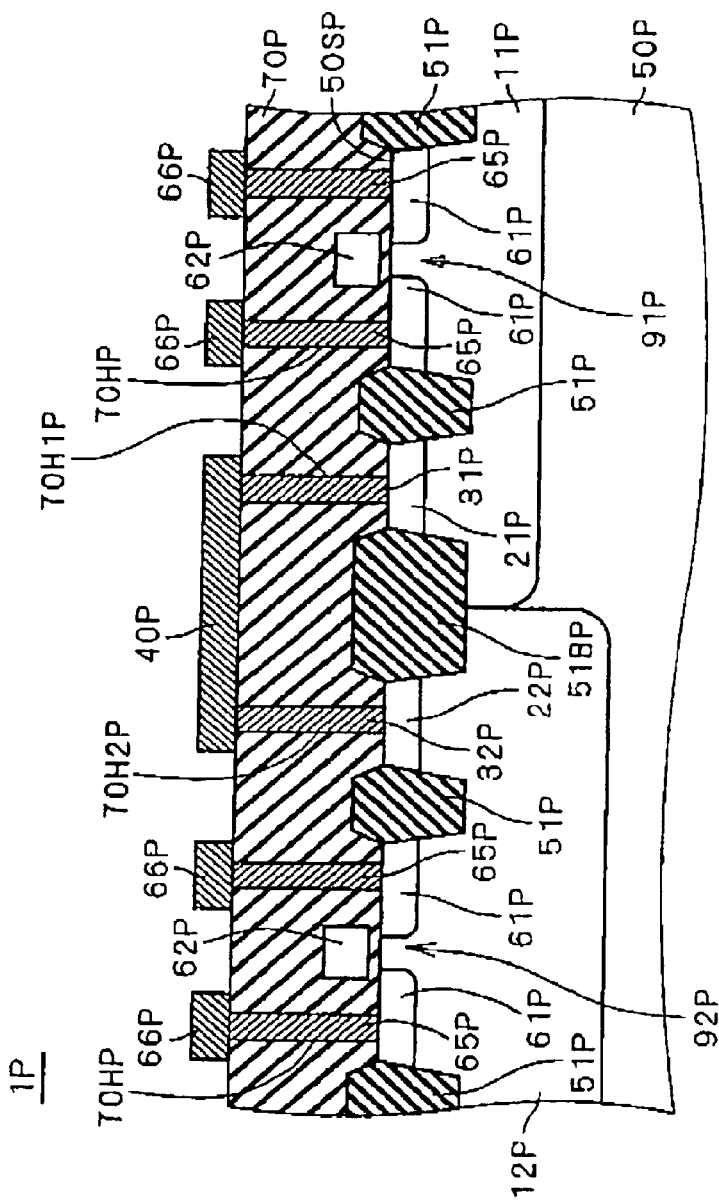
FIG. 22 is a sectional view of a conventional semiconductor device.
Figure 23:
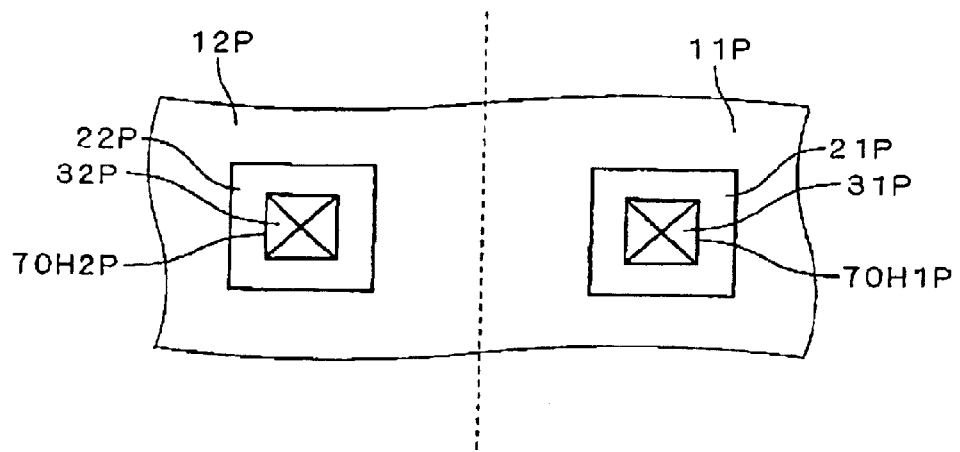
FIG. 23 is a typical plan view for illustrating a part of the conventional semiconductor device.
Figure 24:
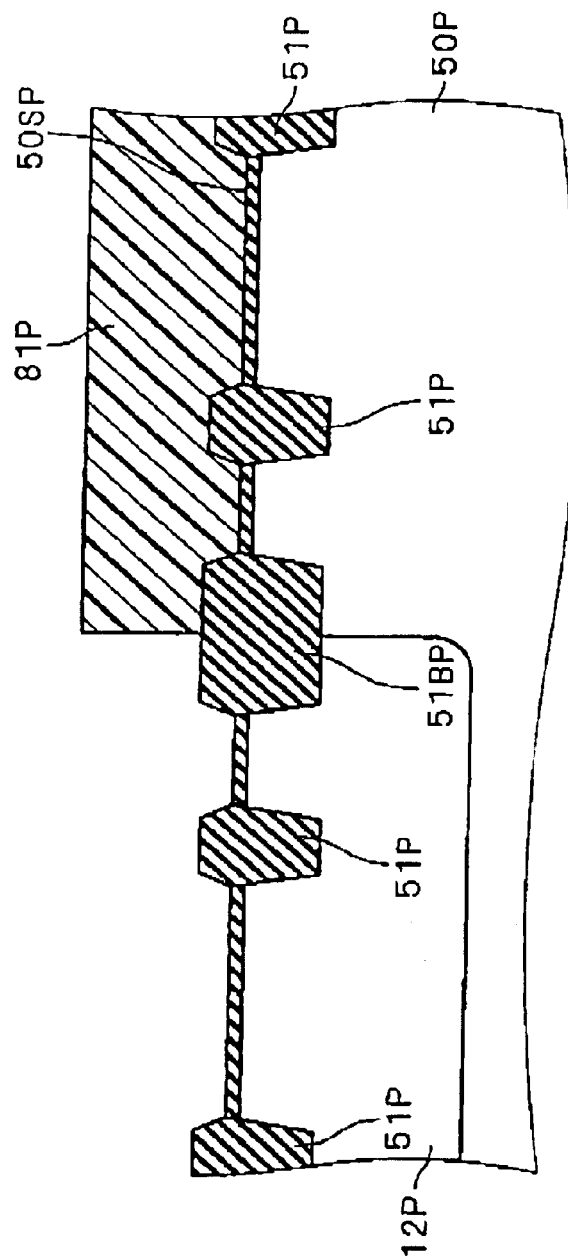
FIGS. 24 to 29 are sectional views for illustrating a method of manufacturing the conventional semiconductor device.
Figure 25:
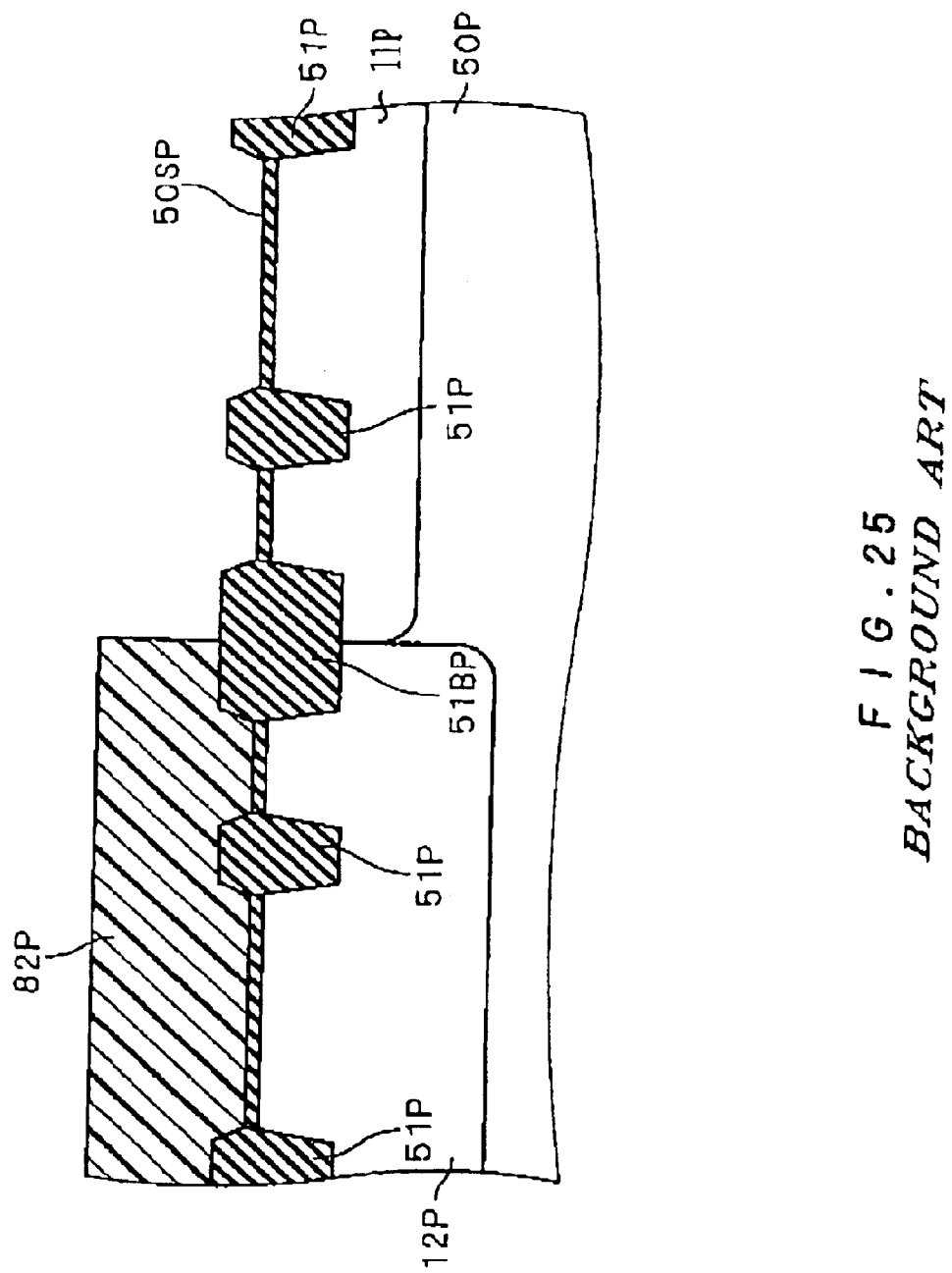
Figure 26:
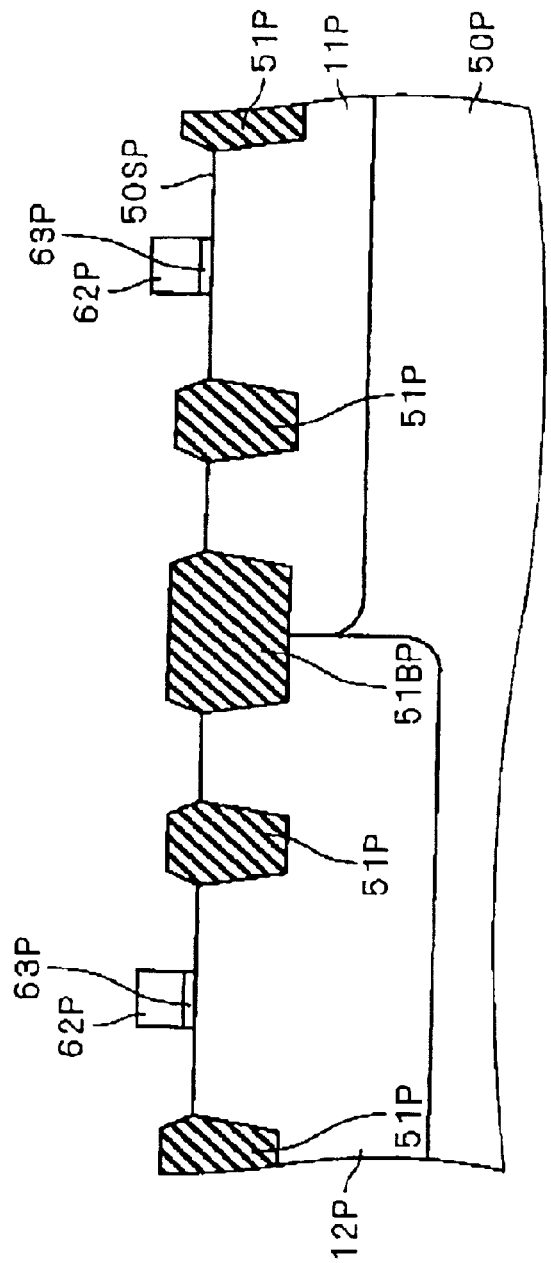
Figure 27:
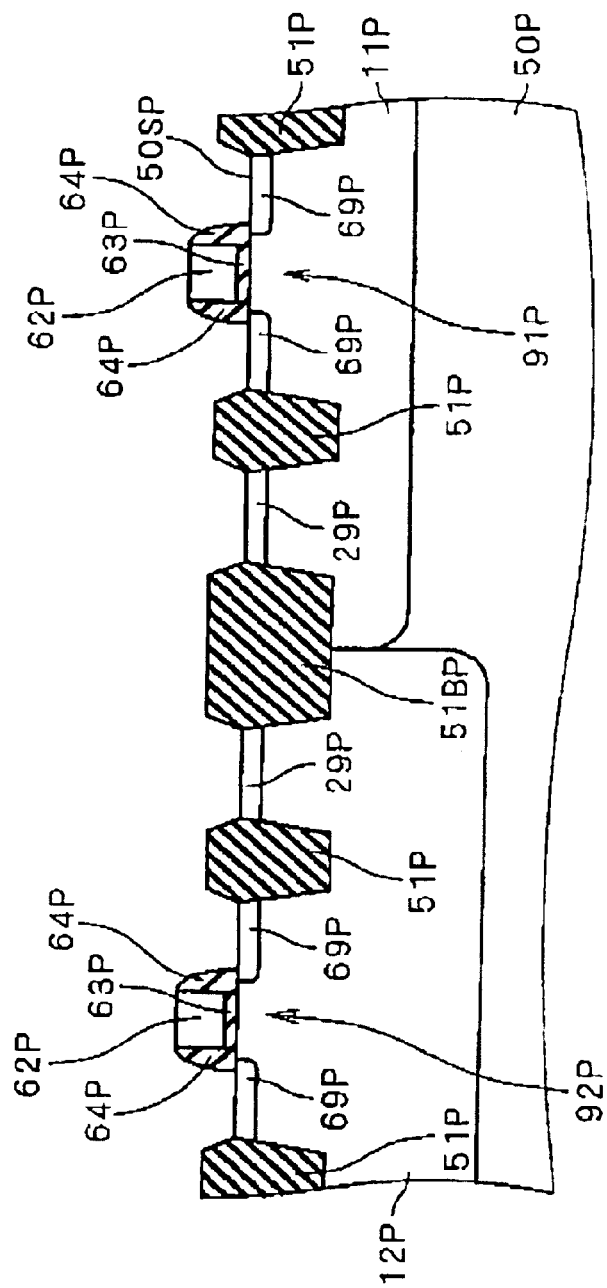
Figure 28:
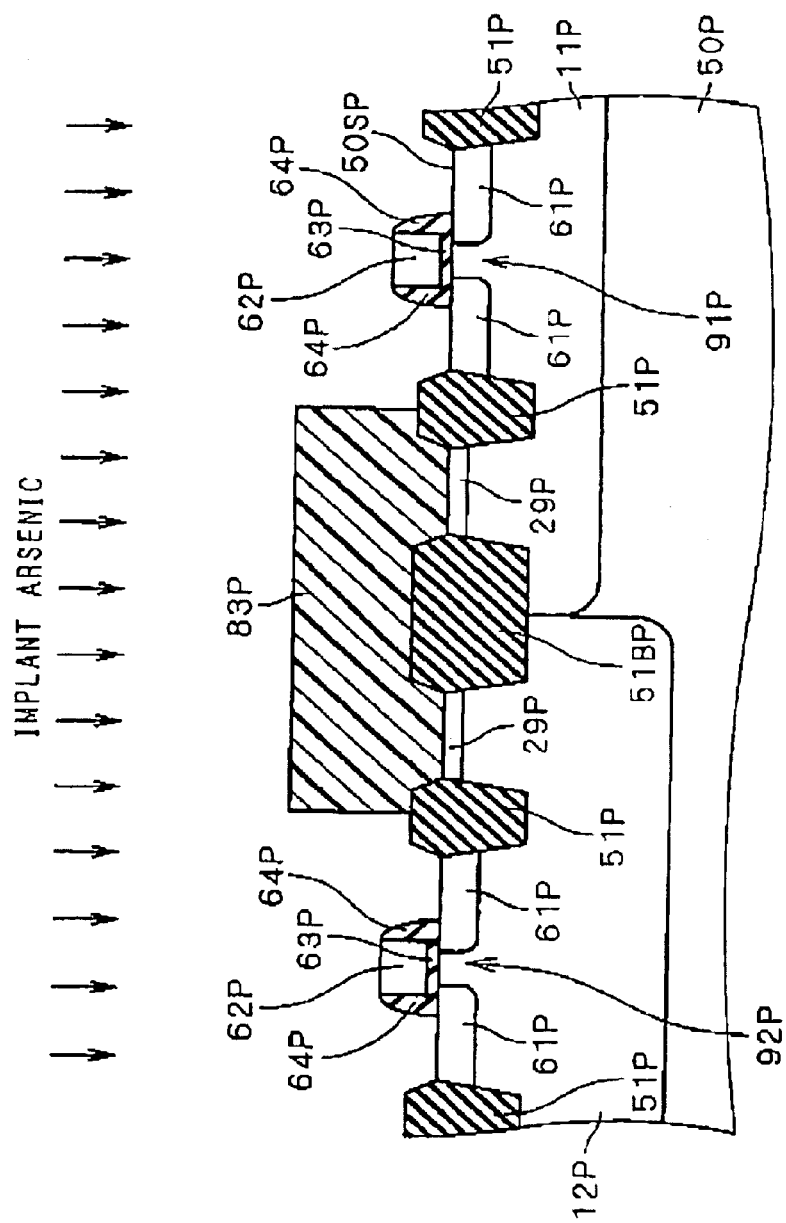
Figure 29:
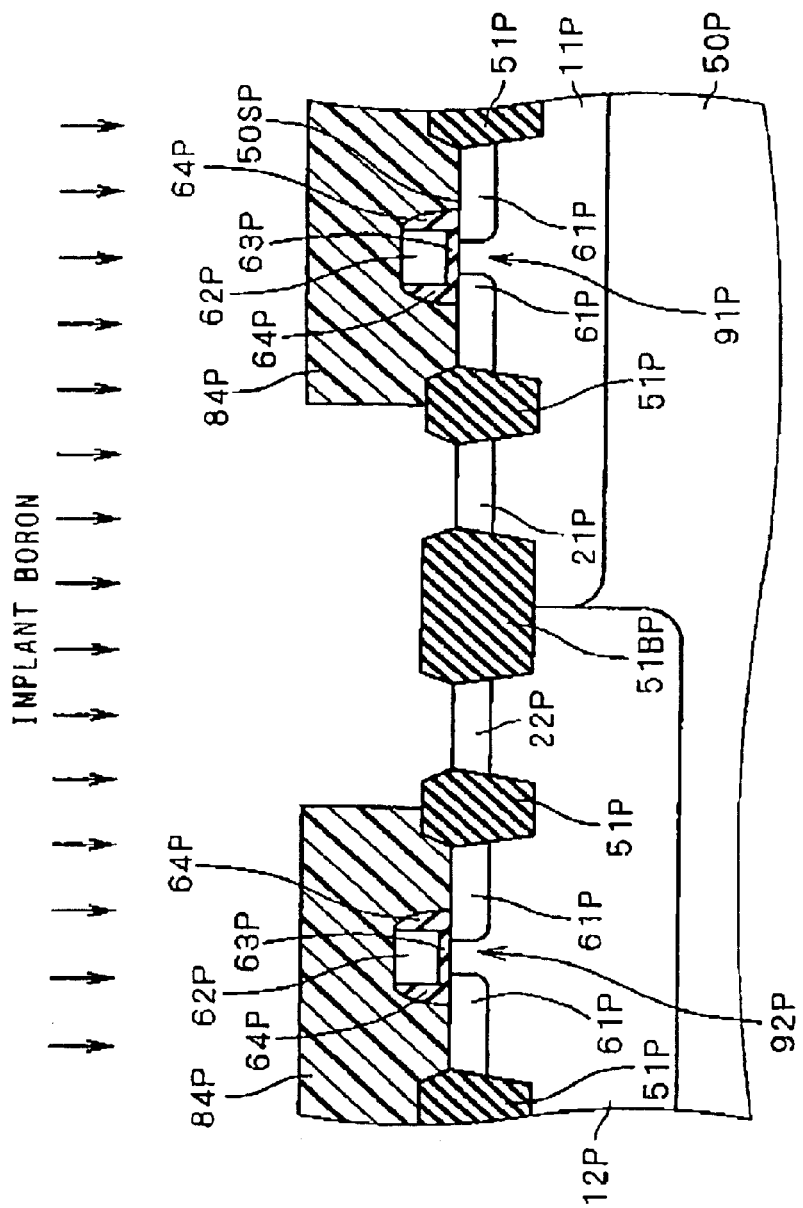
Figure 30:
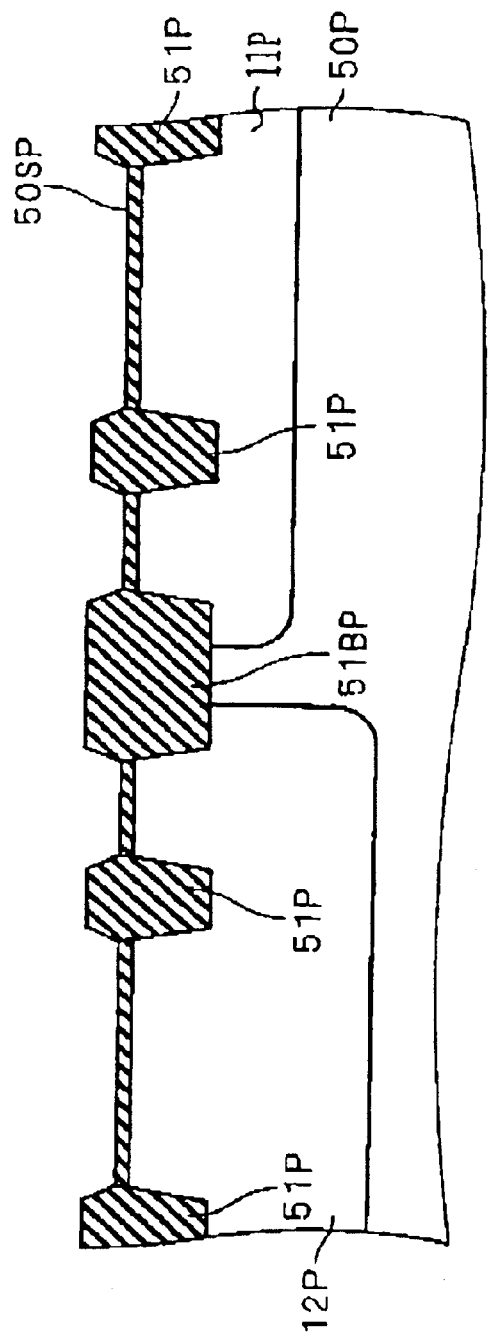
FIG. 30 is a sectional view for illustrating the conventional semiconductor device.
Figure 31:
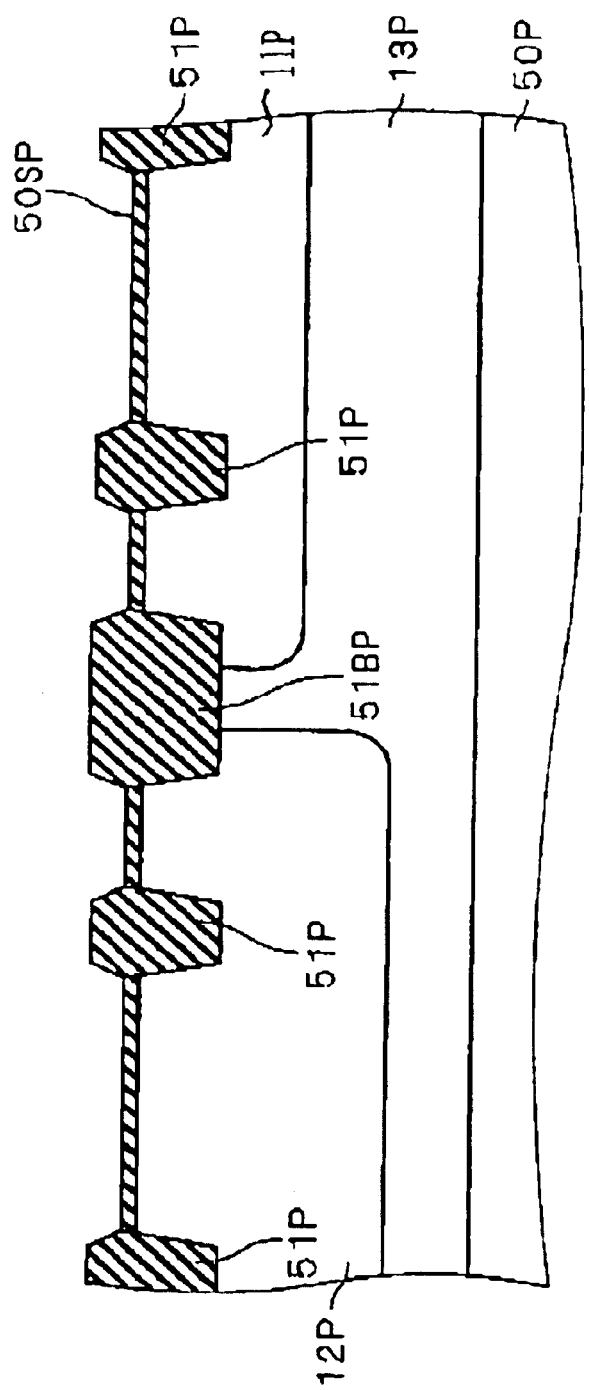
FIG. 31 is a sectional view of another conventional semiconductor device.
Figure 32:
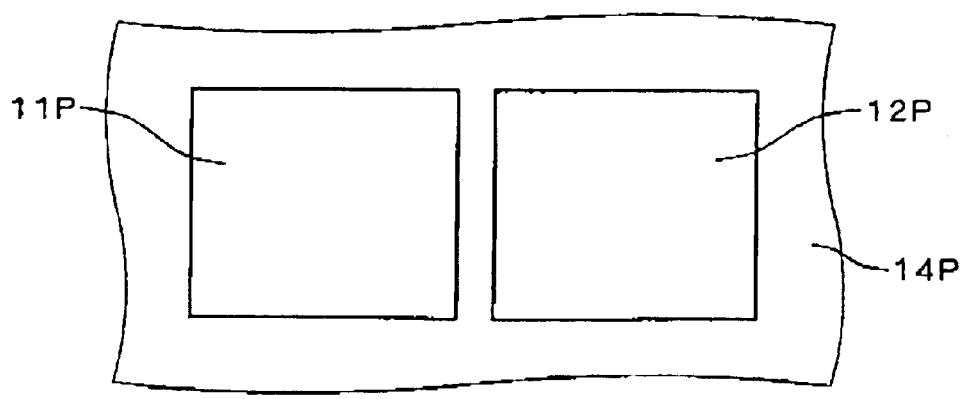
FIG. 32 is a typical plan view for illustrating a part of the other conventional semiconductor device.

Further, according to the semiconductor device 1, P-type layers 21P and 22P and contacts 31P and 32P may not be provided for P wells 11P and 12P dissimilarly to the conventional semiconductor device 1P (see FIG. 22). In addition, the P-type layer 20 is provided in the area AR3 to connect the adjacent P wells 11 and 12 with the minimum distance without providing the conventional element isolation film 51BP. Therefore, the layout area for the P-type layer 20, the contacts 31 and 32 and the wire 40 can be reduced as compared with the conventional semiconductor device 1P. Thus, the overall size of the semiconductor device (or chip) 1 can be reduced. Consequently, the number of semiconductor devices obtainable from a unit wafer is increased so that the cost can be reduced.

Further, the semiconductor device 1 comprises the two contacts 31 and 32, whereby the resistance of the overall contacts for fixing the potentials of the P wells 11 and 12 can be reduced as compared with the case of either one. In addition, the contact 31 is arranged in opposition to the P well 11 and the contact 32 is arranged in opposition to the P well 12. Thus, the potential of the P well 11 can be more stably fixed through the contact 31, while the potential of the P well 12 can be more stably fixed through the contact 32.

<Embodiment 2>

FIG. 14 is a sectional view of a semiconductor device 2 according to an embodiment 2 of the present invention, and FIG. 15 is a typical plan view or layout diagram for illustrating a part of the semiconductor device 2. In the following description, elements equivalent to the aforementioned ones are denoted by the same reference numerals, to omit redundant description. This also applies to an embodiment 3 of the present invention described later etc.

A P-type layer 20 extending over P wells 11 and 12 is formed in an area AR3 of the semiconductor device 2 similarly to the aforementioned semiconductor device 1 (see FIGS. 1 and 2), while neither contact hole 70H2 nor contact 32 is formed in the area AR3 dissimilarly to the semiconductor device 1. In other words, only a contact 31 is arranged in the area AR3 in contact with the P-type layer 20, for electrically connecting the P wells 11 and 12 with each other through the P-type layer 20. The remaining structure of the semiconductor device 2 is similar to that of the semiconductor device 1.

The semiconductor device 2 can be manufactured by applying the aforementioned manufacturing method except forming no contact hole 70H2.

According to the semiconductor device 2, only the contact 31 is arranged in contact with the P-type layer 20, dissimilarly to the aforementioned semiconductor device 1. Therefore, the layout area for the P-type layer 20 in an area AR2 can be reduced as compared with the semiconductor device 1 (see FIGS. 15 and 2), whereby miniaturization of the semiconductor device, increase of the number of semiconductor devices obtainable from a unit wafer and reduction of the cost can be further prompted. Further, a wire other than a wire 40 can also be arranged on the P-type layer 20. In other words, the degree of freedom in layout is improved as compared with the semiconductor device 1.

The contact 31 may alternatively be provided at the boundary between the P wells 11 and 12, for example. When the P wells 11 and 12 are not in contact with each other (see FIGS. 12 and 13), the contact 31 may be provided at the region located between the P wells 11 and 12 (in this case, the contact 31 is not opposed to the P wells 11 and 12).

Only a contact 32 may be provided in place of the contact 31. In this case, the contact 32 corresponds to "first contact", the P well 12 corresponds to "first well" and the P well 11 corresponds to "second well".

<Embodiment 3>

Figure 16:
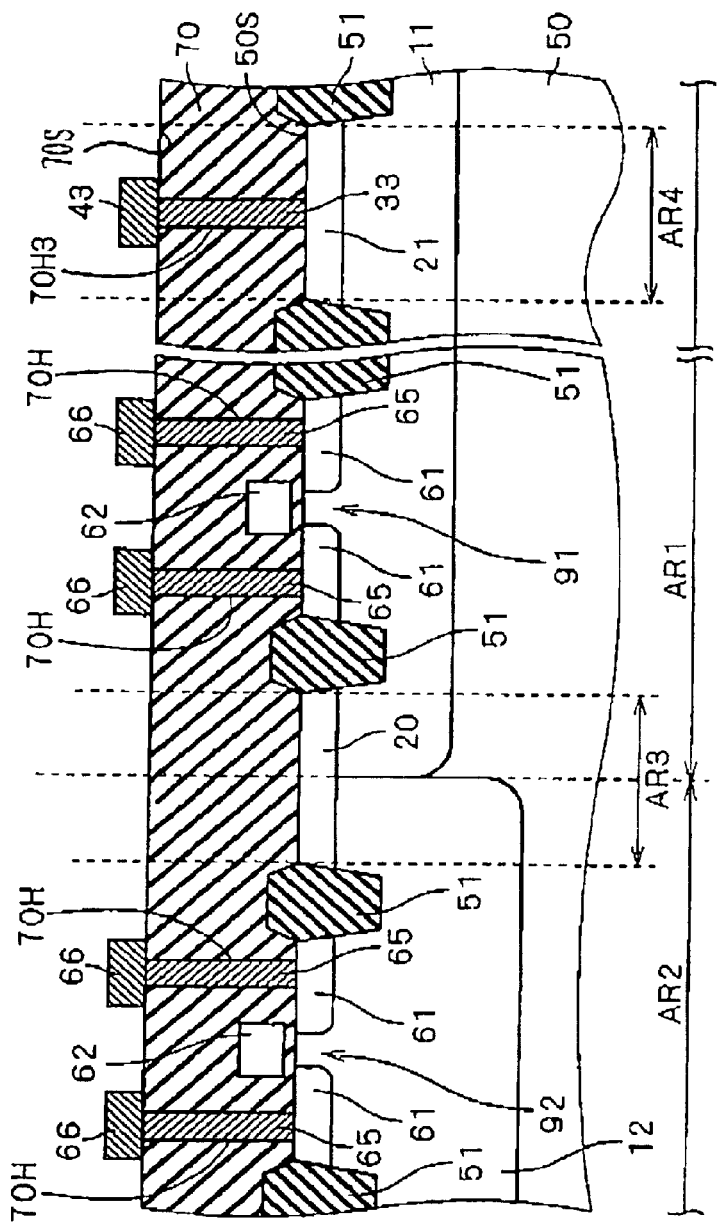
FIG. 16 is a sectional view of a semiconductor device according to an embodiment 3 of the present invention.

FIG. 16 is a sectional view of a semiconductor device 3 according to an embodiment 3 of the present invention, and FIG. 17 is a typical plan view or layout diagram for illustrating a part of the semiconductor device 3.

A P-type well 20 extending over P wells 11 and 12 is formed in an area AR3 of the semiconductor device 3 similarly to the aforementioned semiconductor device 1 (see FIGS. 1 and 2), while neither contact holes 70H1 and 70H2 nor contacts 31 and 32 are formed in the area AR3 dissimilarly to the semiconductor device 1.

In the semiconductor device 3, in particular, a conductive layer (or second conductive layer) 21 is formed in a surface 50S located in an area AR4 included in an area AR1 in contact with the P well 11. The conductive layer 21, provided on the P well 11, is not in contact with the P well 12. The conductive layer 21 consists of a P-type semiconductor layer (or impurity introduction layer) formed shallower than the P well 11 by reducing the resistivity of the surface 50S located in the area AR4 to have lower resistivity than the P well 11 (i.e. to be conductive). The conductive layer 21 is also referred to as "P-type layer 21". The sheet resistance of the conductive layer 21 is about 100 to 10 k $\Omega/\square$, for example.

The P-type layer 21 may alternatively be formed deeper than the P well 11 so far as the same is in contact with the P well 11. In order to simplify the description, it is assumed here that the P-type layer 21 is formed entirely over the surface 50S located in the area AR4.

A contact hole 70H3 extending from a surface 70S to the P-type layer 21 is formed in an interlayer isolation film 70 located in the area AR4, and a contact (or first contact) 33 similar to the aforementioned contacts 31 and 32 is formed in the contact hole 70H3 in contact with the P-type layer 21. Further, a wire 43 is formed on the surface 70S of the interlayer isolation film 70 in contact with the contact 33. The remaining structure of the semiconductor device 3 is similar to that of the semiconductor device 1.

The semiconductor device 3 can be manufactured by applying the aforementioned manufacturing method by forming the P-type layer 21, the contact hole 70H3, the contact 33 and the wire 43 similarly to the P-type layer 20, the contact hole 70H, the contact 31 and the wire 40.

The semiconductor device 3 can attain the following effects: The contact 33 and the P well 11 can be reliably brought into ohmic contact with each other through the P-type layer 21, whereby the potential of the P well 11 can be stably fixed. In this case, the potential of the P well 12 can be stably fixed through the P-type layer 20 regardless of contact/non-contact between the P wells 11 and 12.

Further, no contact may be provided with respect to the P-type layer 20. Therefore, the layout area for the P-type layer 20 can be further reduced as compared with the aforementioned semiconductor devices 1 and 2 (see FIGS. 17, 2 and 15), whereby miniaturization of the semiconductor device, increase of the number of semiconductor devices obtainable from a unit wafer and reduction of the cost can be further prompted. It is absolutely not necessary to provide the wire 40 (see FIG. 1) in the vicinity of the P-type layer 20, whereby another wire can be arranged on the P-type layer 20. In other words, the degree of freedom in layout is further improved as compared with the semiconductor devices 1 and 2.

The P-type layer 21 and the contact 33 may alternatively be provided with respect to the P well 12. In this case, the P well 12 corresponds to "first well" and the P well 11 corresponds to "second well".

<Embodiment 4>

Figure 18:
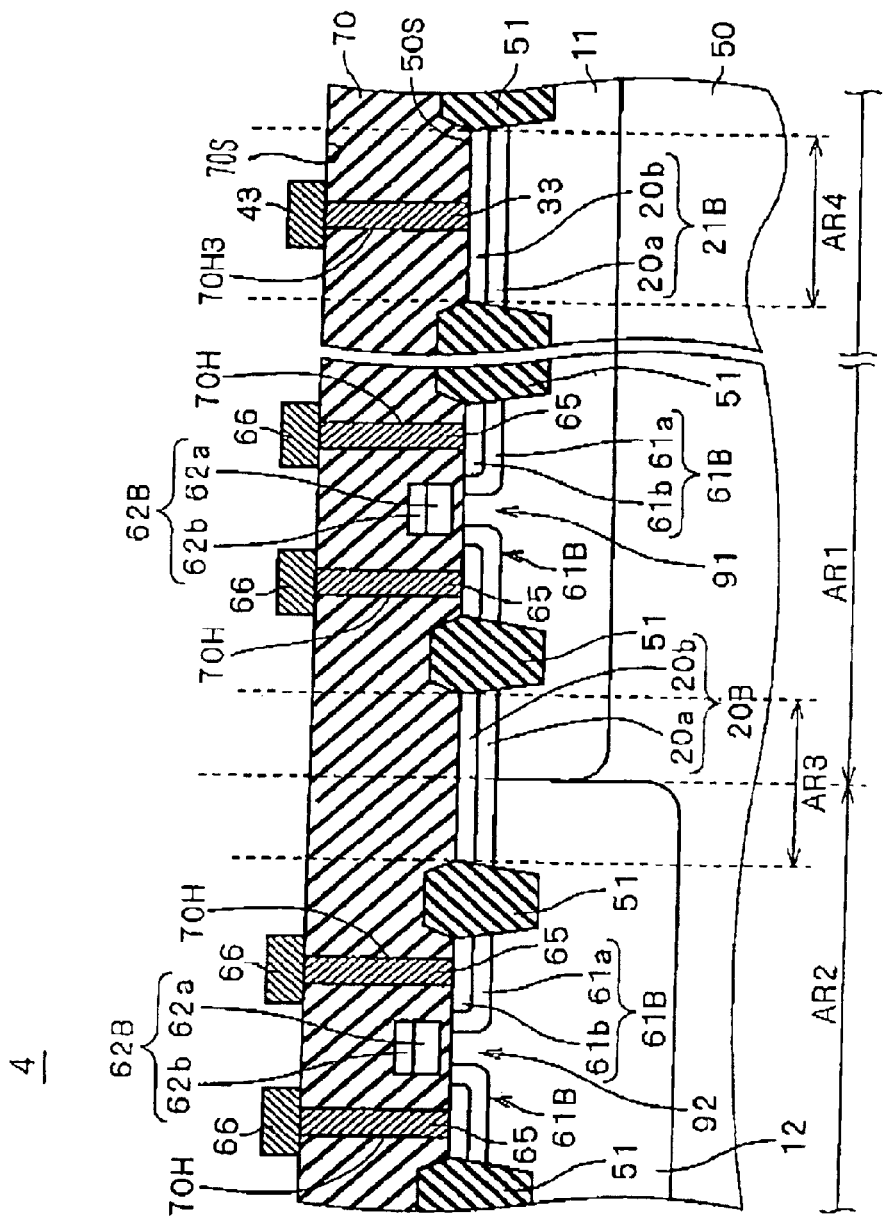
FIG. 18 is a sectional view of a semiconductor device according to an embodiment 4 of the present invention.

FIG. 18 is a sectional view of a semiconductor device 4 according to an embodiment 4 of the present invention. The semiconductor device 4, having a structure basically similar to that of the aforementioned semiconductor device 3 (see FIG. 16), comprises a (first) conductive layer 20B, a (second) conductive layer 21B, source/drain regions 61B and gate electrodes 62B in place of the P-type layers (or conductive layers) 20 an 21, the source/drain regions 61 and the gate electrodes 62 of the semiconductor device 3. While the aforementioned P-type layers 20 and 21, source/drain regions 61 and gate electrodes 62 are made of a single material (silicon), the conductive layers 20B and 21B, the source/drain regions 61B and the gate electrodes 62B include (a) P-type semiconductor layers (or impurity introduction layers) of the same conductivity type as P wells 11 and 12 and (b) compound layers of a material (silicon here) for a substrate 50 and a metal. Ti, Ni or Co is applicable as the metal, for example, and the compound corresponds to the so-called silicide in this case.

In more detail, the (first) conductive layer 20B and the (second) conductive layer 21B are formed by a silicide layer (or compound layer) 20b formed in a surface 50S of the substrate 50 and a silicon layer 20a in contact with the silicide layer 20b. The silicon layer 20a consists of a P-type semiconductor having lower resistivity than the P wells 11 and 12, similarly to the P-type layers 20 and 21.

While the silicon layer 20a is entirely formed deeper than the silicide layer 20b from the surface 50S here, the silicon layer 20a may be formed to enclose the silicide layer 20b in the surface 50S, i.e., the silicide layer 20b may be formed in the silicon layer 20a. In the semiconductor device 4, a contact 33 is arranged in contact with the silicide layer 20b of the conductive layer 21B.

Each source/drain region 61B is formed by a silicide layer 61b formed in the surface 50S of the substrate 50 and a silicon layer 61a in contact with the silicide layer 61b. The silicon layer 61a consists of a material similar to that for the aforementioned source/drain regions 61. Each gate electrode 62B is formed by a silicon (e.g. polysilicon) layer 62a formed on the surface 50S of the substrate 50 and a silicide layer 62b formed on the silicon layer 62a to hold the silicon layer 62a along with the substrate 50. The remaining structure of the semiconductor device 4 is similar to that of the semiconductor device 3.

Figure 10:
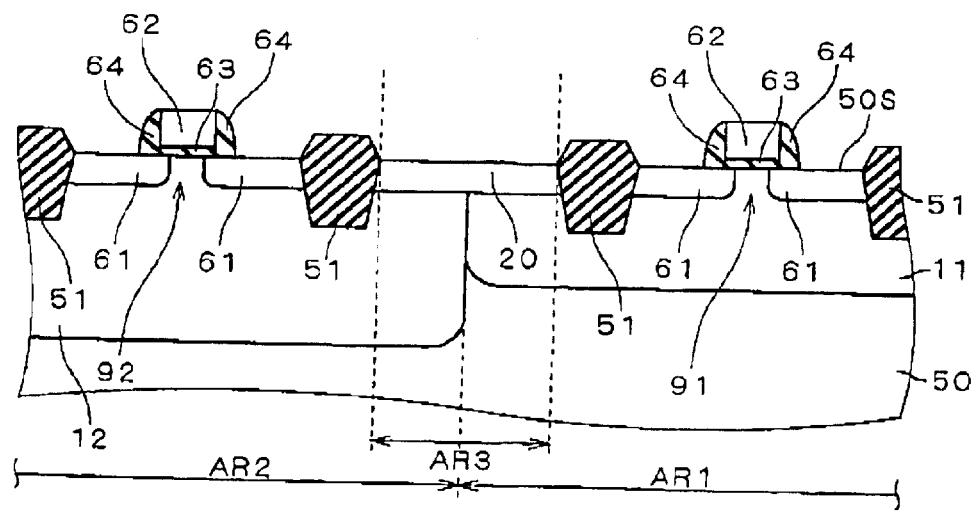
Figure 19:
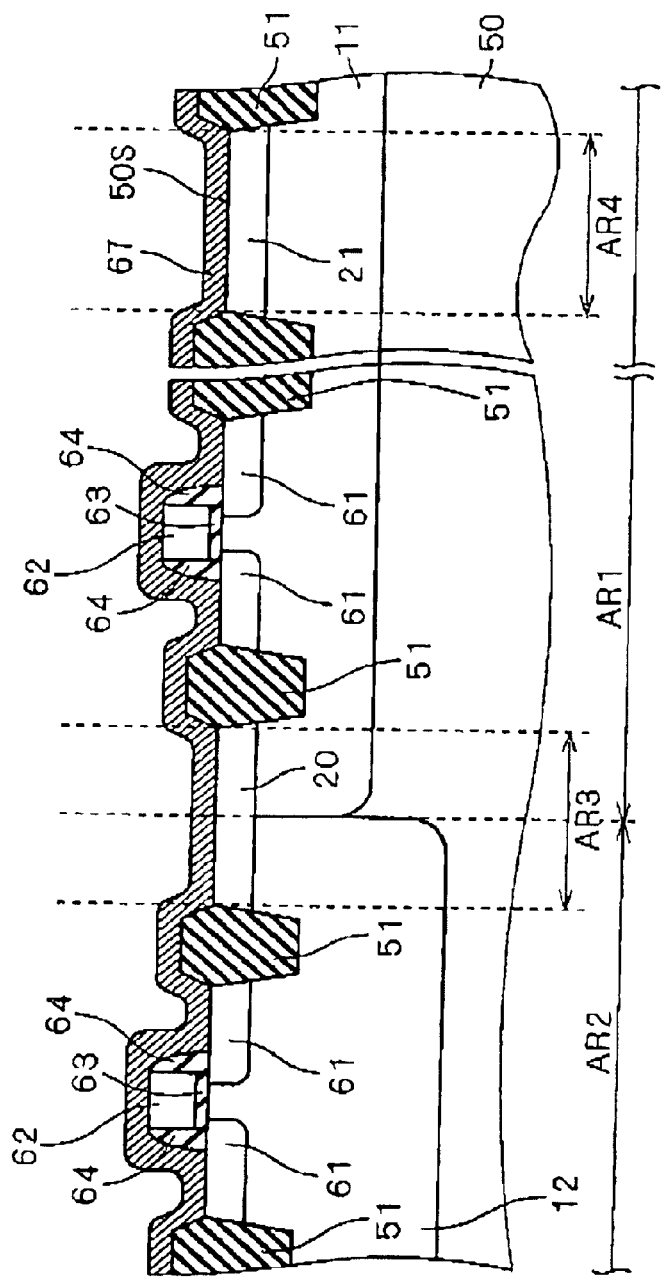
FIGS. 19 and 20 are sectional views for illustrating a method of manufacturing the semiconductor device according to the embodiment 4.
Figure 20:
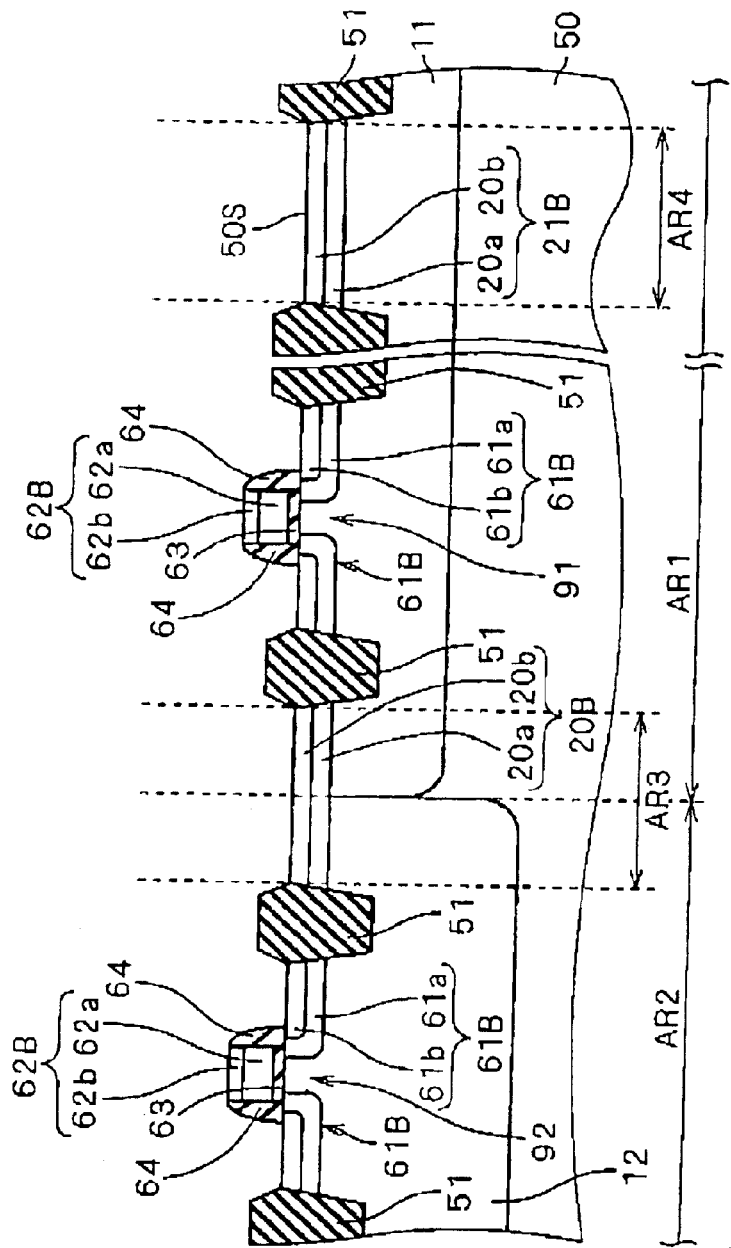

FIGS. 19 and 20 are sectional views for illustrating a method of manufacturing the semiconductor device 4. The method of manufacturing the semiconductor device 4 is described with reference to these figures. A substrate or a semiconductor device in the state shown in FIG. 10 is prepared by the aforementioned manufacturing method or the like. It is assumed here that the gate electrodes 62 are made of polysilicon.

Then, a metal film 67 of Ti, Ni or Co is formed on the surface 50S to cover the P-type layers 20 and 21 etc. (see FIG. 19). Then, heat treatment is performed thereby causing silicide reaction between the metal film 67 and the P-type layers 20 and 21 etc. consisting of silicon in contact with the metal film 67. Thus, the P-type layers 20 and 21 are silicified for forming the silicide layers 20b, 61b and 62b. In this case, remaining portions of the layers 20, 21, 61 and 62 form the silicon layers 20a, 61a and 62a. The conductive layers 20B and 21B, the source/drain regions 61B and the gate electrodes 62B are formed through this step. Thereafter unreacted parts of the metal film 67 are removed (see FIG. 20). It is also possible to form the silicide layer 20b by depositing silicide on the surface 50S thereby reducing the resistivity of the surface 50S.

Thereafter the interlayer isolation film 70, the contacts 33 and 65 and wires 43 and 66 are formed through the aforementioned manufacturing method or the like, thereby completing the semiconductor device 4 shown in FIG. 18.

According to the semiconductor device 4, the conductive layers 20B and 21B include the silicide layers 20b (compound of the semiconductor and the metal), whereby the resistivity can be remarkably reduced as compared with the P-type layers 20 and 21. Therefore, the potentials of the P wells 11 and 12 can be more stably fixed as compared with the semiconductor device 3. The aforementioned effect can be attained also when replacing either one of the P-type layers 20 and 21 of the semiconductor device 3 with the conductive layer 20B or 21B. The conductive layer 21B has lower resistivity than the P well 11, and hence the P well 11 and the contact 33 can be excellently brought into ohmic contact with each other.

<Modification 1 of Embodiment 4>

The aforementioned conductive layer 20B etc. may be applied in place of the P-type layer (or conductive layer) 20 etc. of the semiconductor device 1, as in a semiconductor device 5 shown in a sectional view of FIG. 21. In this case, contacts 31 and 32 are arranged in contact with a silicide layer 20b of the conductive layer 20B. Also according to the semiconductor device 5, the potentials of P wells 11 and 12 can be stably fixed and the P wells 11 and 12 can be excellently brought into ohmic contact with contacts 31 and 32. Similarly, the conductive layer 20B etc. may be applied in place of the P-type layer (or conductive layer) 20 etc. of the semiconductor layer 2.

<Modification 2 of Embodiment 4>

The conductive layers 20B and 21B, the source/drain regions 61B and the gate electrodes 62B may be entirely prepared from silicide (or compound layers), so that effects similar to those of the semiconductor device 4 can be attained.

Silicide has lower resistivity than silicon in general, and hence conductive layers 20B and 21B of low resistivity can be formed also by silicifying the P wells 11 and 12 or the substrate 50 having higher resistivity than the P-type layers 20 and 21. In other words, the P-type layers 20 and 21 may not be previously formed in steps of manufacturing the semiconductor device 5. In consideration of this point, silicon of the conductive layers 20 and 21 serving as the material for the silicide portions may not be doped with an impurity.

<Modification 1 Common to Embodiments 1 to 4>

Also when the two P wells 11 and 12 have the same impurity profile, the aforementioned effects by the conductive layers 20 and 21 are attained.

<Modification 2 Common to Embodiments 1 to 4>

Effects similar to those of the aforementioned semiconductor devices can be attained also when reversing the conductivity types, i.e., exchanging the N- and P-types in each of the aforementioned semiconductor devices.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a semiconductor substrate;
    a first well of a prescribed conductivity type at which a first active element is provided, said first well being selectively formed in a surface of said semiconductor substrate;
    a second well of the same conductivity type as said prescribed conductivity type at which a second active element is provided, said second well being selectively formed in said surface of said semiconductor substrate and adjacent to said first well;

a first conductive layer across said first well and said second well in said surface of said semiconductor substrate with an end provided on said first well and another end provided on said second well, said first conductive layer electrically connecting said first well and said second well;

a first contact situated directly above said first well; and a second contact situated directly above said second well;

wherein said first and second contacts are connected to a single potential and the first conductive layer has the same conductivity type as said prescribed conductivity type of said first and second wells.

2. The semiconductor device according to claim 1, wherein
said first contact is in contact with said first conductive layer.

3. The semiconductor device according to claim 2, wherein said second contact is in contact with said first conductive layer.

4. The semiconductor device according to claim 3, wherein
said first contact is arranged in opposition to said first well through said first conductive layer while said second contact is arranged in opposition to said second well through said first conductive layer.

5. A The semiconductor device according to claim 1, wherein
said first conductive layer includes at least one of an impurity introduction layer of the same conductivity type as said prescribed conductivity type and a compound layer of the material for said semiconductor substrate and a metal.

6. The semiconductor device according to claim 5, wherein
said first conductive layer has lower resistivity than said first well and said second well.

7. The semiconductor device according to claim 1, wherein
said first well and said second well have different impurity profiles.

8. The semiconductor device according to claim 1, wherein the first and second semiconductor elements are first and second transistors respectively.

9. A semiconductor device comprising:

a semiconductor substrate;

a first well of a prescribed conductivity type at which a first active element is provided, said first well being selectively formed in a surface of said semiconductor substrate;

a second well of the same conductivity type as said prescribed conductivity type at which a second active element is provided, said second well being selectively formed in said surface of said semiconductor substrate and adjacent to said first well;

a first conductive layer across said first well and said second well in said surface of said semiconductor substrate with an end provided on said first well and another end provided on said second well, said first conductive layer electrically connecting said first well and said second well;

a first contact electrically connected with said first well; and a second conductive layer formed in said surface of said semiconductor substrate and provided on said first well without being in contact with said second well, wherein said first contact is in direct contact with said second conductive layer and the first conductive layer has the same conductivity type as said prescribed conductivity type of said first and second wells.

10. The semiconductor device according to claim 9, wherein
said second conductive layer includes at least one of an impurity introduction layer of the same conductivity type as said prescribed conductivity type and a compound layer of the material for said semiconductor substrate and a metal.

11. The semiconductor device according to claim 10, wherein
said second conductive layer has lower resistivity than said first well.

12. The semiconductor device according to claim 9, wherein said second well is deeper than said first well.

13. A semiconductor device comprising:

a semiconductor substrate;

a first well of a prescribed conductivity type selectively formed in a surface of said semiconductor substrate and including a first active element;

a second well of the same conductivity type as said prescribed conductivity type selectively formed in a surface of said semiconductor substrate and adjacent to said first well, and including a second active element;

a conductive layer across said first well and said second well in said surface of said semiconductor substrate with an end provided on said first well and another end provided on said second well, said conductive layer of the same conductive type as said presecribed conductivity type and including a compound layer of the material for said semiconductor substrate and a metal; and a first and second contacts directly connected to said conductive layer and connected to a single potential.

14. The semiconductor device according to claim 13, wherein said conductive layer further includes an impurity introduction layer of the same conductivity type as said prescribed conductivity type positioned under said compound layer.

* * * * *